United States Patent
Park et al.

(10) Patent No.: US 10,075,175 B2
(45) Date of Patent: Sep. 11, 2018

(54) APPARATUS AND METHOD FOR AUTOMATIC BANDWIDTH CALIBRATION FOR PHASE LOCKED LOOP

(71) Applicant: INTEL CORPORATION, Santa Clara, CA (US)

(72) Inventors: Young Min Park, Folsom, CA (US); Mark Elzinga, El Dorado, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/464,039

(22) Filed: Mar. 20, 2017

(65) Prior Publication Data

US 2017/0257106 A1 Sep. 7, 2017

Related U.S. Application Data

(63) Continuation of application No. 14/954,819, filed on Nov. 30, 2015, now Pat. No. 9,634,826.

(51) Int. Cl.
*G04F 10/00* (2006.01)
*H03M 1/06* (2006.01)

(52) U.S. Cl.
CPC ........ *H03M 1/0626* (2013.01); *G04F 10/005* (2013.01); *H03M 1/0607* (2013.01)

(58) Field of Classification Search
CPC ......... G04F 10/005; G04F 10/06; H03L 7/08; H03L 7/0331; H03M 1/0626; H03M 1/0607

See application file for complete search history.

(56) References Cited

U.S. PATENT DOCUMENTS

| | | | |
|---|---|---|---|
| 7,795,937 B2 * | 9/2010 | Smith | H03L 7/07 327/149 |
| 7,888,973 B1 | 2/2011 | Rezzi et al. | |
| 8,072,361 B2 | 12/2011 | Henzler | |
| 2003/0076181 A1 | 4/2003 | Tabatabaei et al. | |
| 2006/0103566 A1 * | 5/2006 | Vemulapalli | G04F 10/005 341/155 |
| 2006/0267697 A1 | 11/2006 | Lee | |
| 2007/0279135 A1 | 12/2007 | Hull | |
| 2010/0277244 A1 | 11/2010 | Chang | |
| 2013/0257497 A1 | 10/2013 | Thelen | |
| 2014/0266848 A1 | 9/2014 | Henzler et al. | |

(Continued)

OTHER PUBLICATIONS

International Search Report and Written Opinion, dated Dec. 19, 2016 for PCT Patent No. PCT/US16/52296.

(Continued)

*Primary Examiner* — Vineeta Panwalkar
(74) *Attorney, Agent, or Firm* — Green, Howard & Mughal LLP

(57) ABSTRACT

Described is an apparatus which comprises: a time-to-digital converter (TDC) to receive a reference clock and a feedback clock, wherein the TDC is to generate a digital output code representing a time difference between the reference clock and the feedback clock; a circuitry to apply a digital code to an output of the TDC; and a node to receive the digital output code from the TDC and the digital code from the circuitry, wherein the circuitry is to monitor the digital output code and to control the TDC according to at least the monitored digital output code.

22 Claims, 14 Drawing Sheets

(56) References Cited

U.S. PATENT DOCUMENTS

2014/0333351 A1  11/2014  Ba et al.

OTHER PUBLICATIONS

Marzin et al., "A Background Calibration Technique to Control, Bandwidth in Digital PLLs" ISSCC 2014/Session 2/ Ultra-High-Speed Transceivers and Technques/2.9 (3 pages).
Non-Final Office Action dated Aug. 26, 2016, for U.S. Appl. No. 14/954,819.
Notice of Allowance for U.S. Appl. No. 14/954,819 dated Dec. 19, 2016.

* cited by examiner

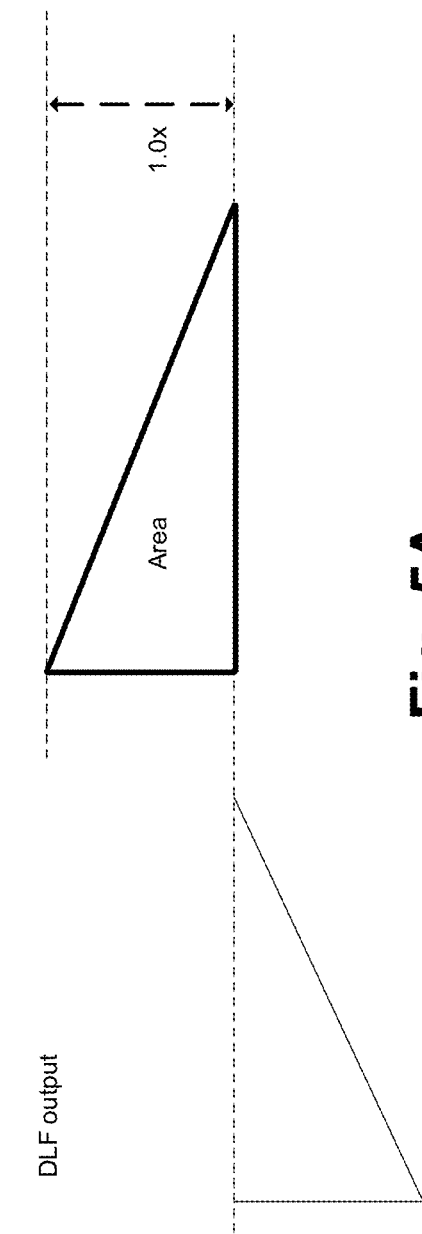
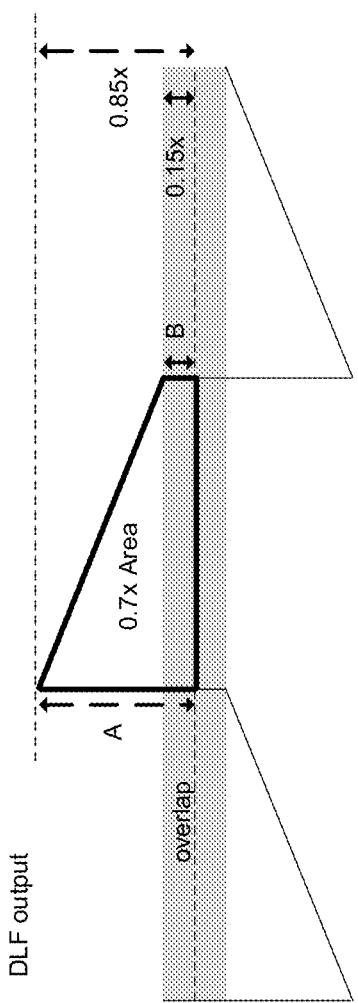

APPARATUS AND METHOD FOR AUTOMATIC BANDWIDTH CALIBRATION FOR PHASE LOCKED LOOP

CLAIM OF PRIORITY

This application is a continuation application and claims the benefit of priority from U.S. patent application Ser. No. 14/954,819, titled, "APPARATUS AND METHOD FOR AUTOMATIC BANDWIDTH CALIBRATION FOR PHASE LOCKED LOOP," filed Nov. 30, 2015, which is incorporated by reference in its entirety for all purposes.

BACKGROUND

An accurate control of Phase Locked Loop (PLL) bandwidth is an important factor to optimize jitter performance in wireline and wireless communication systems. PCIe (Peripheral Components Interface Express) bus standard, for example, dictates a bandwidth range (e.g., 2 MHz to 5 MHz) for transmitter (Tx) PLLs and receiver (Rx) PLLs to address the tight jitter budget, and the standard also requires compliance tests for devices following the standard. Even when the PLL bandwidth is not specified by the standards, efficient system jitter budgeting can be performed through accurate bandwidth control, as such, filtering noise from each system component.

As process scales, however, PLL components are further affected by process, voltage, and temperature (PVT) variations, causing higher PLL bandwidth variation. To satisfy jitter performance and/or compliance with the standards, expensive tests and PLL bandwidth calibration techniques have been required.

The conventional off-chip bandwidth test with a signal generator is cost prohibitive for high volume manufacturing (HVM). Some solutions for addressing the problems associated with conventional off-chip bandwidth test are either measurement-only solutions or the interface for the calibration is still an analog component, which is vulnerable to another variation from the calibration steps. Also, analog PLL components (e.g. varactor) may suffer from process variations, so there may be yield concerns with or without performance of calibration steps.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 5A-B illustrate plots of DLF output patterns with low and high frequencies for modulating the TDC output (or input to the DLF), in accordance with some embodiments.

DETAILED DESCRIPTION

Figure 1:
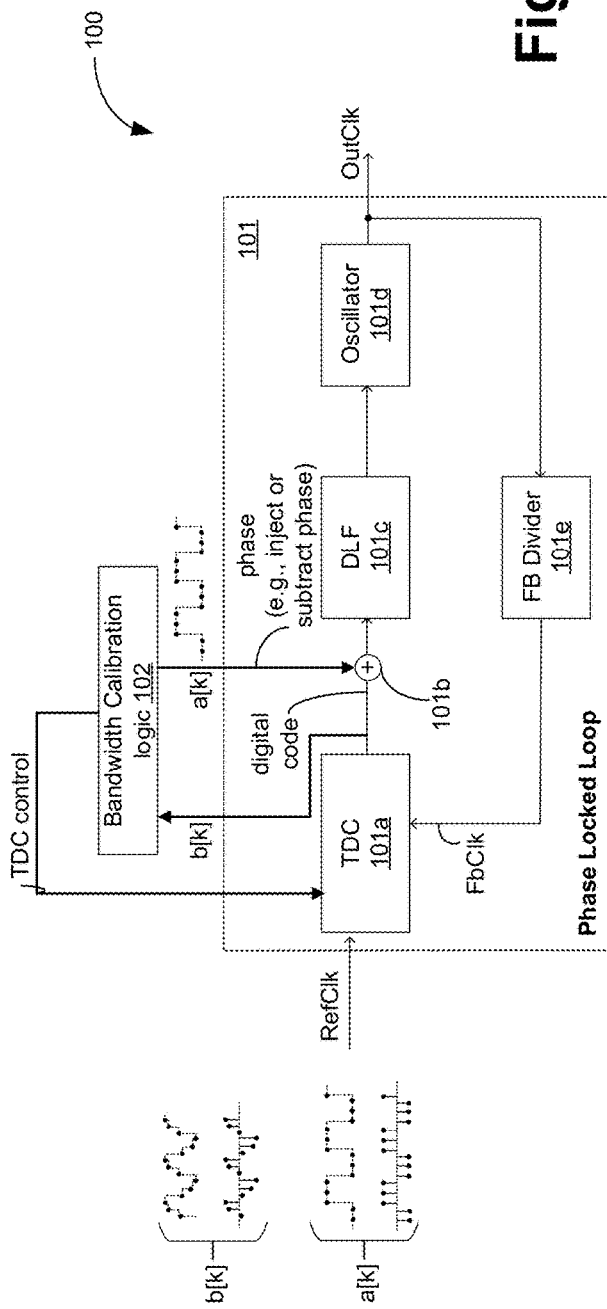
FIG. 1 illustrates a high level schematic of a phase locked loop (PLL) controlled by an apparatus for bandwidth calibration based on an output of a time-to-digital converter (TDC), according to some embodiments of the disclosure.

Some embodiments describe an on-die apparatus and method for calibrating bandwidth of a phase locked loop (PLL) by monitoring an output of a Time-to-Digital Converter (TDC). Some embodiments describe an on-die apparatus and method for calibrating bandwidth of a PLL by monitoring an output of a Digital Loop Filter (DLF). In some embodiments, the outputs of both TDC and DLF can be monitored and the resolution of the TDC can be adjusted (e.g., increased or decreased) to calibrate the bandwidth of the PLL. Various embodiments are digital in nature in that the mechanisms for monitoring the outputs of the TDC and/or DLF and adjusting the PLL bandwidth are performed using digital signals and digital circuits. A digital signal is a physical signal that is a representation of a sequence of discrete values (e.g., a quantified discrete-time signal), for example, of an arbitrary bit stream or of a digitized (e.g., sampled and analog-to-digital converted) analog signal.

In some embodiments, the on-die apparatus and method for calibrating the bandwidth are based on a digital PLL (DPLL) architecture where most interface signals between the building blocks of the PLL are binary codes so that modulation, measurement, and adjustment are all performed by a state machine inside the PLL logic block(s). As such, the calibration process is fast enough to be performed at every reset of the PLL, in accordance with some embodiments of the disclosure.

In some embodiments, the calibration is based on the PLL closed loop response including all components in the closed loops. For example, bandwidth variations caused by the TDC, DLF, digitally controlled oscillator (DCO) or voltage controlled oscillator (VCO), divider, buffers, etc. that together form the PLL closed loop, are taken into account to calibrate the PLL bandwidth. Previous solutions for calibrating the PLL bandwidth measure one component of the loop (e.g., DCO/VCO) at a time, and then calibrate the component or another component (e.g., TDC or DLF) to address the variation in the bandwidth. These traditional solutions take multiple steps to address all components of the PLL, and they are still error-prone since they rely on a linear PLL system model.

The bandwidth calibration process of the various embodiments is based on two modulation frequencies, low-end and high-end frequencies. In some embodiments, the low-end and high-end frequencies are configurable. As such, the calibration scheme of the various embodiments is flexible to apply various bandwidth target ranges. The low-end modulation frequency is selected to be the target lower frequency bound of the PLL bandwidth while the high-end modulation frequency is selected to be the target higher frequency bound of the PLL bandwidth. The modulation frequency here generally refers to the how often an apparatus repeats to add or subtract a same pattern of digital code to and from a node, respectively, where the node also receives a digital output code from the TDC. As such, the digital code modulates the digital output code from the TDC and this modulation results in a new digital code which is input to the DLF.

In some embodiments, the modulation amplitude of the digital code provided by the apparatus (e.g., bandwidth control logic) is configurable. As such, the apparatus can calibrate the PLL bandwidth with a variable phase input range of the digital code. In some embodiments, due to non-linearity, the PLL bandwidth can be measured differently at different modulation amplitudes. Here, the term "modulation amplitude" generally refers to the amplitude of the digital code which is added (e.g., injected) and/or subtracted (e.g., removed) from the node that also receives the digital output code from the TDC.

The process of adding and subtracting the digital code to and from the TDC digital output code, where this process occurs at a mixing node, causes amplitude modulation of the digital output code of the TDC in a subsequent clock cycle. The flexible amplitude of the digital code from the apparatus (e.g., bandwidth control logic) provides targeted and/or comprehensive PLL bandwidth calibration, in accordance with some embodiments.

While the various embodiments are described with reference to calibrating the bandwidth of a PLL, the same concepts are applicable for calibrating the bandwidth of a delay locked loop (DLL). A DLL has substantially the same building blocks as a PLL and so the same apparatus for calibrating the PLL bandwidth can be used for calibrating the bandwidth of the DLL. In one such embodiment, the DLL is a digital DLL.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left" "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

FIG. 1 illustrates a block diagram (or high level schematic) 100 of a PLL controlled by an apparatus for bandwidth calibration based on an output of a TDC, according to some embodiments of the disclosure. In some embodiments, block diagram 100 includes PLL 101 controlled by apparatus 102 (e.g., bandwidth control logic). In some embodiments, PLL 101 is a digital PLL (DPLL) which includes TDC 101a, mixing node 101b, DLF 101c, oscillator 101d, and Divider 101e. For the sake of not obscuring the various embodiments, a simplified version of the PLL is shown. A person skilled in the art would realize that other logic blocks/circuits such as lock detector, start-up circuits, can be part of a PLL but are not shown here.

In some embodiments, TDC 101a is circuit that recognizes time events and provides a digital representation of the time the events occurred. The digital representation is a digital output code with a certain number of bits. The time represented by one Least Significant Bit (LSB) in the digital code defines the resolution of TDC 101a. The resolution of TDC 101a can be configured regardless of the number of bits, in accordance with some embodiments. For example, one LSB can represent 1 picosecond (ps) or 10 ps measurement for a given number of bits.

In some embodiments, by modifying the resolution of TDC 101a, the bandwidth of the PLL can be adjusted. For example, by increasing or decreasing the resolution of TDC 101a, the bandwidth of the PLL can be adjusted. In the context of PLL 101, TDC 101a provides a difference in time between an edge of a reference clock (RefClk) and an edge of a feedback clock (FbClk). In some embodiments, TDC 101a is implemented as a counter. In some embodiments, TDC 101a is a Vernier Line TDC. In some embodiments, the resolution of TDC 101a is operable to be finely adjusted by a control code from apparatus 102.

In some embodiments, DLF 101c is a first order digital filter. In some embodiments, DLF 101c is a higher order digital filter. Any suitable digital filter can be used to implement DLF 101c. In some embodiments, DLF 101c receives the digital output code from TDC 101a and converts it to a frequency representation which is a filtered form of the digital output code. In some embodiments, the output of DLF 101c is received by oscillator 101d.

In some embodiments, oscillator 101d is a digitally controlled oscillator (DCO). In some embodiments, oscillator 101d is a voltage controlled oscillator (VCO). In some embodiments, oscillator 101d is an inductor-capacitor (LC) oscillator. In one such embodiment, the inductance 'L' of the LC oscillator is fixed and the capacitance 'C' is variable and controlled by the output of DLF 101c. Any suitable design for an oscillator may be used for implementing oscillator 101d.

The output of oscillator 101d generates an output clock which is used by other logic blocks outside of PLL 101 (which are not shown here). In some embodiments, the output clock is received by Divider 101e which divides the frequency of the output clock to be of the same frequency as the frequency of the reference clock. In some embodiments, Divider 101e is controlled by a sigma-delta modulator. In some embodiments, Divider 101e is operable to divide the frequency of the output clock by an integer or a fraction.

In some embodiments, apparatus 102 is a bandwidth calibration logic which monitors the output of TDC 101a and controls the resolution of TDC 101a. In some embodiments, the bandwidth calibration logic adds (e.g., injects) or subtracts (e.g., removes) a digital code to or from the output of TDC 101a. In some embodiments, this addition or subtraction of the digital code, generated by apparatus 102, to or from the digital output code (generated by TDC 101a) is performed at mixing node 101b. In some embodiments, by injecting or subtracting the digital code to or from the digital output code (i.e., the output of TDC 101a), phase modulation is performed on the resultant code. This resultant code is a new digital code received by DLF 101c, in accordance with some embodiments.

The injected and subtracted code is a sequence of ones and zeros with a particular frequency. This frequency is a modulation frequency. Here, the term "modulation frequency" generally refers to how often apparatus 102 switches between addition and subtraction of the digital code. The digital code from apparatus 102 forms a phase modulated signal whose sign is inverted every "N/2" reference clock cycles, for example, where 'N' is an even integer.

In some embodiments, the digital code from apparatus 102 is a step signal which represents digital code a[k] whose modulation frequency is a reference frequency divided by a number (e.g., number of resolution bits of TDC 101a). For example, a[k] is a[1:10]={5,5,5,5,5,−5,−5,−5,−5,−5} over 10 reference clock cycles, whose modulation frequency is the reference frequency divided by 10. The effect of the digital code a[k] provided by apparatus 102 to mixing node 101b is similar to the effect when a RefClk with square phase modulation is input to TDC 101a using, for example, an external off-die equipment.

In some embodiments, the modulation phase amplitude is less than the resolution of TDC 101a. If the desired phase modulation is less than one LSB of the TDC code, the impact of phase modulation may not be measured, in accordance with some embodiments. For instance, to observe PLL response to phase modulation with amplitude of 10 ps while the resolution of TDC is greater than 10 ps, it may not be possible to measure and/or calibrate the PLL bandwidth based on the 10 ps phase input.

In some embodiments, the modulation frequency is configurable. For example, the modulation frequency can be set to a low frequency (e.g., 2 MHz) or a high frequency (e.g., 5 MHz). In some embodiments, apparatus 102 is a finite state machine (FSM) which implements the processes discussed with reference to FIG. 3. Referring back to FIG. 1, in some embodiments, apparatus 102 is a digitally synthesized logic. While the embodiments here illustrate apparatus 102 as being separate from PLL 101, it can be integrated within PLL 101. For example, apparatus 102 can be integrated within the boundary of PLL 101.

In some embodiments, the closed loop of PLL 101 responds to the inserted phase (e.g., the digital code inserted by apparatus 102), and the response of PLL 101 can be monitored through the digital output code from TDC 101a. For example, when step phase modulation is applied by apparatus 102 at mixing node 101b by injecting and subtracting a digital code to and from the digital output code of TDC 101a, respectively, the PLL closed loop corrects the inserted phase, and the response is observed by apparatus 102.

As the closed loop of PLL 101 corrects for the inserted phase, the output digital code of TDC 101a changes. For example, the amplitude of the output digital code of TDC 101a increases or decreases from its previous value. The TDC digital output code represents the phase response of PLL 101, and the DLF output code represents a frequency response of PLL 101, which can be further analyzed as a phase response, in accordance with some embodiments.

In some embodiments, the FSM of apparatus 102 monitors the digital output code of TDC 101a at multiple modulation frequencies, thus measuring the PLL bandwidth. The accuracy of the bandwidth measurement may be affected by a reference clock noise (e.g., noise of RefClk). In some embodiments, apparatus 102 repeats the measurement at each modulation frequency to average out the reference clock noise.

For example, apparatus 102 applies a step phase modulation with a first frequency (e.g., a low frequency of 2 MHz) to determine whether the current bandwidth of PLL 101 is below or above the first frequency. In some embodiments, apparatus 102 sets the first frequency to be higher than the low-end target PLL bandwidth. In some embodiments, after apparatus 102 applies the step phase modulation with the first frequency, apparatus 102 checks if the −3 dB bandwidth of the PLL is above or below the first frequency. Here, the term "step phase modulation" generally refers to the modulation of the TDC digital output code after it is mixed with the digital code from apparatus 102 at mixing node 101b.

In some embodiments, apparatus 102 compares the amplitude of the TDC digital output code to the amplitude of the digital code provided by apparatus 102. In some embodiments, the result of the comparison is used by apparatus 102 to determine whether the −3 dB bandwidth of the PLL is above or below the first frequency.

For example, apparatus 102 determines whether the amplitude of TDC output is above or below 70% (i.e., first threshold) of the amplitude of the digital code generated by apparatus 102 for mixing at mixing node 101b. Here, 70% of the amplitude corresponds to the −3 dB point. In some embodiments, the amplitude threshold (e.g., first threshold) is a programmable threshold. For example, the amplitude threshold can be programmed by software, firmware, and/or hardware.

In some embodiments, if apparatus 102 determines that the −3 dB bandwidth of PLL 101 is below the first frequency, then apparatus 102 instructs TDC 101a to decrease its resolution and the step phase modulation is applied again. For example, a TDC resolution of 1 ps provides higher PLL bandwidth compared to TDC resolution of 2 ps. This process of applying a step phase modulation and monitoring the amplitude of the digital output code from TDC 101a continues till apparatus 102 determines that the −3 dB bandwidth of the PLL is equal or greater than the first frequency, in accordance with some embodiments.

In some embodiments, the output digital code from TDC 101a is monitored by apparatus 102 at a node before the phase injection. In some embodiments, the amplitude of the output digital code from TDC 101a is expected to be higher than the threshold (in opposite sign) when the PLL bandwidth is higher than the modulation frequency (because the PLL closed loop is supposed to make the input to DLF 101c zero). For example, when the phase injection code (e.g., the digital code generated by apparatus 102 and provided to mixing node 101b), $a_k$ or $a[k]=\{5,5,5,5,5,-5,-5,-5,-5,-5\}$, then TDC digital output code, $b_k$ or $b[k]=\{b_1,b_2,b_3,b_4,-5, b_6,b_7,b_8,b_9,5\}$, where PLL 101 corrects the injected phase error by five reference clocks.

In some embodiments, the number of iterations for the bandwidth measurements by apparatus 102 is configured based on the noise level of the systems. In some embodiments, apparatus 102 adjusts the resolution of TDC 101a by digital control code(s). These digital control code(s) are generated by apparatus 102, in accordance with some embodiments. The digital control code(s) may indicate to TDC 101a to increase or decrease its resolution by a particular amount. As such, the bandwidth of PLL 101 is adjusted to be above the first frequency (e.g., the lower bandwidth threshold). In some embodiments, the input to DLF 101c becomes zero or substantially zero after the adjustment of the TDC resolution brings the PLL bandwidth above the first frequency.

In some embodiments, after PLL bandwidth is adjusted to be above the first frequency, apparatus 102 adjusts the PLL bandwidth to be lower than a second frequency (e.g., 5 MHz). The second frequency here refers to the upper bound (i.e., high-end) of the PLL bandwidth while the first frequency refers to the lower bound (i.e., low-end) of the PLL bandwidth.

In some embodiments, apparatus 102 applies a step phase modulation with the second frequency (e.g., a high frequency of 5 MHz) to determine whether the current bandwidth of PLL 101 is below or above the second frequency. In some embodiments, apparatus 102 sets the second frequency to be higher than the target PLL bandwidth. In some embodiments, after apparatus 102 applies the step phase modulation with the second frequency, apparatus 102 checks if the −3 dB bandwidth of PLL 101 is above or below the second frequency.

In some embodiments, apparatus 102 compares the amplitude of the TDC output to the amplitude of the digital code from apparatus 102. In some embodiments, the result of the comparison is to determine whether the −3 dB bandwidth of PLL 101 is above or below the second frequency. For example, apparatus 102 determines whether the amplitude of TDC output is above or below 70% (i.e., second threshold) of the amplitude of the digital code from apparatus 102 which is provided to mixing node 101b. Here, 70% of the amplitude corresponds to the −3 dB point.

In some embodiments, the amplitude threshold (e.g., the second threshold) is a programmable threshold. For example, the amplitude threshold can be programmed by software, firmware, and/or hardware. In some embodiments, the first and second thresholds are programmed to be of the same threshold level. In some embodiments, the first and second thresholds are programmed to be of different threshold levels. As such, in some embodiments, the first and second thresholds can be programmed differently and independently.

In some embodiments, if apparatus 102 determines that the −3 dB bandwidth of the PLL is above or equal to the second frequency, then apparatus 102 instructs TDC 101a to adjust (e.g., increase or decrease) its resolution and the step phase modulation is applied again. This process of applying a step phase modulation and monitoring the amplitude of the TDC output continues till apparatus 102 determines that the −3 dB bandwidth of PLL 101 is equal or less than the second frequency.

Like for the case of adjusting PLL bandwidth with reference to the first frequency, the number of iterations for the bandwidth measurements by apparatus 102 with reference to the second frequency is configured based on the noise level of the reference clock, in accordance with some embodiments. In some embodiments, apparatus 102 adjusts the resolution of TDC 101a by digital control code(s). These digital control code(s) are generated by apparatus 102, in accordance with some embodiments. As such, the bandwidth of the PLL is adjusted to be below the second frequency (i.e., the upper bandwidth threshold).

By injecting a digital code of two different modulating frequencies and adjusting the TDC resolution for the two cases (e.g., for the case when the digital code is injected having a first frequency and then injected with a digital code having a second frequency), the PLL bandwidth is calibrated to be between those two modulation frequencies, in accordance with some embodiments.

Figure 2:
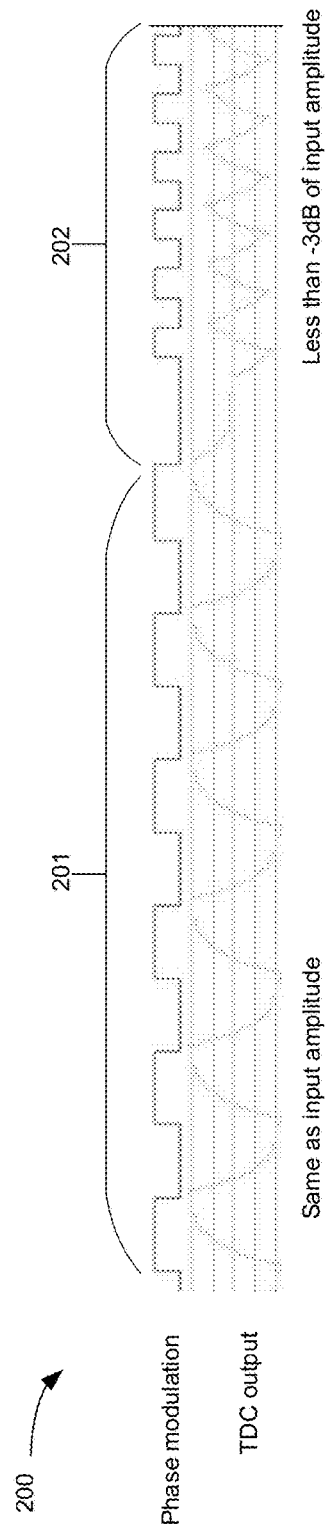
FIG. 2 illustrates a plot showing an output of the TDC when phase modulation signal with different frequencies is injected at an output of the TDC.

FIG. 2 illustrates plot 200 showing an output of the TDC after a digital code is injected with different modulation frequencies. It is pointed out that those elements of FIG. 2 having the same reference numbers (or names) as the elements of any other figure can operate or function in any manner similar to that described, but are not limited to such.

Section 201 of plot 200 illustrates the case where the PLL bandwidth is above the lower bound (e.g. higher than 2 MHz). In this section, the TDC output reaches its intended amplitude when the digital code is applied by apparatus 102. Section 202 of plot 200 illustrates the case where the PLL bandwidth is less than the higher bound (e.g., less than 5 MHz). In this section, the TDC output fails to reach its intended amplitude when the digital code is applied by apparatus 102.

For example, the amplitude of the digital output code of TDC 101a is less than 70% of the amplitude of the digital code generated by apparatus 102. FIG. 2 also shows that the bandwidth of the PLL is already between lower bound and higher bound, representing how TDC output responds to two different modulation frequencies. In this example, the bandwidth is above 70% at lower modulation frequency, and it is below 70% at higher modulation frequency.

Figure 3:
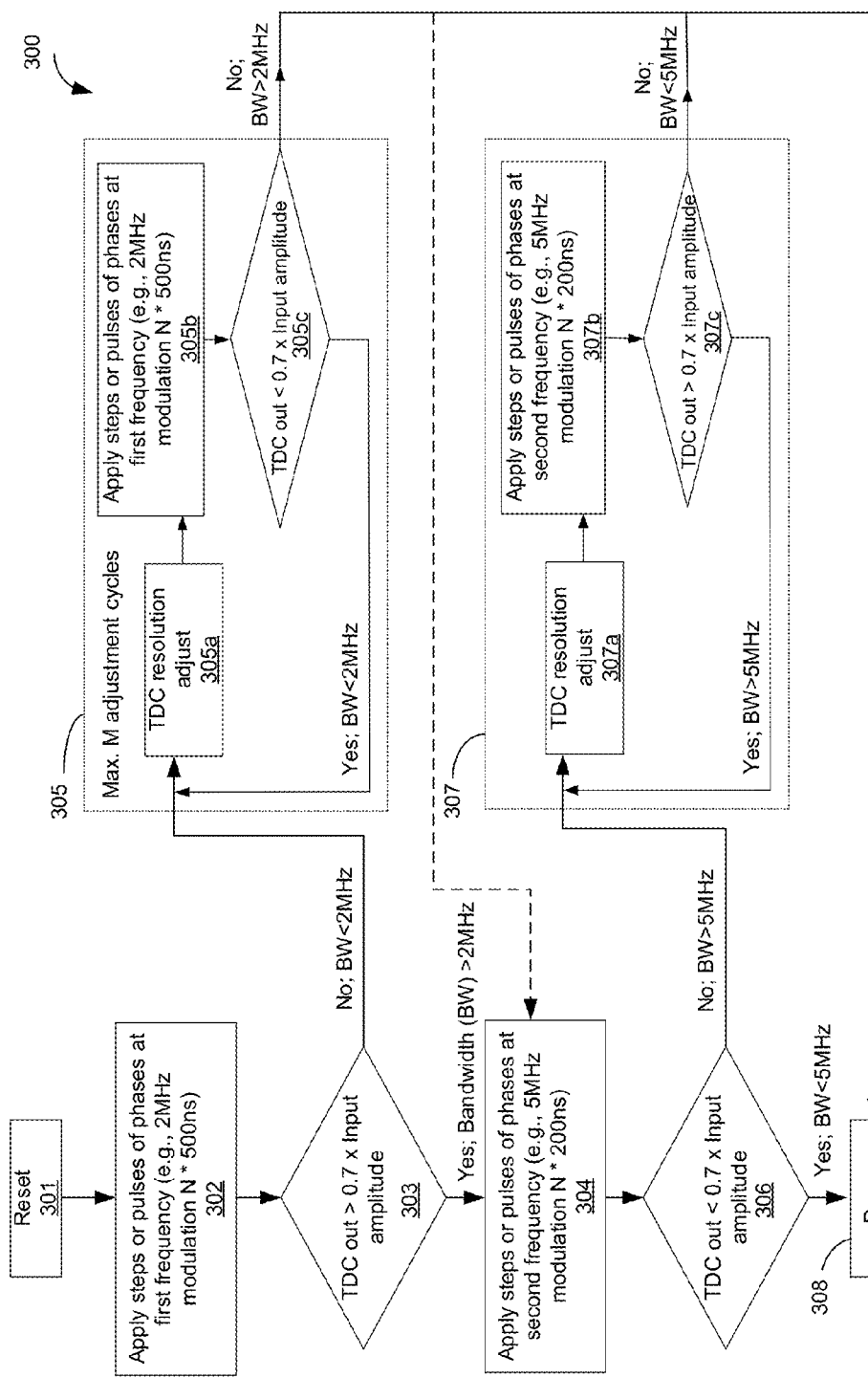
FIG. 3 illustrates a flowchart of a method for calibrating bandwidth of a PLL based on the output of the TDC, according to some embodiments of the disclosure.

FIG. 3 illustrates flowchart 300 of a method for calibrating the bandwidth of PLL 101 based on the output of TDC 101a, according to some embodiments of the disclosure. It is pointed out that those elements of FIG. 3 having the same reference numbers (or names) as the elements of any other figure can operate or function in any manner similar to that described, but are not limited to such.

Although the blocks in the flowchart with reference to FIG. 3 are shown in a particular order, the order of the actions can be modified. Thus, the illustrated embodiments can be performed in a different order, and some actions/blocks may be performed in parallel. Some of the blocks and/or operations listed in FIG. 3 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Flowchart 300 illustrates a method of PLL bandwidth calibration using schematic 100 in which apparatus 102 monitors the output of TDC 101a. The example described with reference to FIG. 3 is applicable for Peripheral Component Interconnect Express (PCIe) Generation 3 (Gen3) Specification as described by PCI Express Base Specification Revision 3.1 Released Oct. 8, 2014. In PCIe Gen 3, the PLL bandwidth is to be between 2 MHz (i.e., 500 ns) and 5 MHz (i.e., 200 ns). However, flowchart 300 can work with other technologies and standards, and is not limited to PCIe Gen3. For example, flowchart 300 can operate when the PLL bandwidth is to be in the range of 0.5 MHz to 1 MHz.

In flowchart 300, 'N' is the number of modulation cycles repeated to average noise in the RefClk, and 'M' is the number of corrections of resolution of TDC 101a to calibrate the bandwidth of PLL 101 within two input frequencies—a first frequency (i.e., lower frequency bound of PLL bandwidth) and a second frequency (i.e., upper frequency bound of the PLL bandwidth). In some embodiments, the lower and upper frequency bounds are integer divisions of the RefClk frequency. For example, for a reference clock frequency of 100 MHz, the first frequency can be 0.5 MHz and the second frequency can be 1 MHz.

In this case, the PLL bandwidth is generally defined by the output phase of TDC 101a compared to the amplitude of the phase modulation. Flowchart 300 can be used for PLL architectures where the resolution of TDC 101a is fine enough compared to the modulated phase amplitude, in accordance with some embodiments. The modulated phase amplitude is the amplitude of the digital output code of TDC 101a after a digital code from apparatus 102 is injected to mixing node 101b, for example.

In some embodiments, TDC 101a is a highly linear TDC as opposed to a non-linear TDC. A highly linear TDC refers to a TDC whose output amplitude is proportional to the time difference between two input edges. A highly linear TDC allows for accurate −3 dB point measurements. However, the embodiments are not limited to highly linear TDCs, and can operate with non-linear TDCs too. In accordance with some embodiments, the TDC output based bandwidth calibration uses a linear TDC, while DLF output based bandwidth calibration, as described with reference to FIGS. 4-7, can work with a non-linear TDC.

Referring back to FIG. 3, at block 301, apparatus 102 determines whether PLL 101 or processor is being reset. For example, apparatus 102 can calibrate the bandwidth when PLL 101 is being reset. At block 302, apparatus 102 applies a pulse or step signal at first frequency (e.g., 2 MHz). For example, an 'N' number of pulses of a period of 500 ns each are applied to mixing node 101b and PLL 101 in closed loop is allowed to relock or resettle (such that the input of the DLF 103c becomes substantially zero). Here, the first frequency is the lower frequency bound of the PLL bandwidth range. The first frequency indicates how often apparatus 102 switches between injecting (e.g., adding) and removing (e.g., subtracting) of the digital code from the digital output code of TDC 101a at mixing node 101b.

At block 303, apparatus 102 makes a determination whether the amplitude of the digital output code of TDC 101a is greater than a threshold of an input amplitude. Here, the threshold is 0.7 (i.e., 70% of the input amplitude) and the input amplitude is the amplitude of the digital code input to mixing node 101b by apparatus 102. If apparatus 102 makes a determination that the amplitude of the output of TDC 101a is greater than 70% of the amplitude of the digital code from apparatus 102, the process proceeds to block 304. Otherwise, the process proceeds to block 305. At block 305, the resolution of TDC 101a is adjusted over a number of iterations of adding and subtracting of the digital code.

For example, after 'M' iterations of comparing the amplitude of TDC output and adjusting of TDC resolution, the output of TDC 101a becomes greater than or equal to 70% of the amplitude of the digital code from apparatus 102. One example of sub-flowchart inside block 305 is shown by blocks 305a, 305b, and 305c.

At block 305a, apparatus 102 adjusts the resolution of TDC 101a. At block 305b, apparatus 102 applies (e.g., injects and subtracts) steps or 'N' pulses at first frequency (e.g., 2 MHz or 500 ns) to mixing node 101b. At block 305c, apparatus 102 makes a determination whether the amplitude of the TDC digital output code is less than 70% (i.e., first threshold) of the amplitude of the digital code from apparatus 102. If the amplitude of the digital output code from TDC 101a is less than 70% of the amplitude of the digital code from apparatus 102, the process proceeds to block 305a. Otherwise, the process proceeds to block 308.

In some embodiments, when the TDC resolution is adjusted by very fine steps (e.g., by a small fraction of the current resolution), then once block 305 completes and the process reaches block 308, the PLL bandwidth is considered to be above the lower frequency bound (e.g., 2 MHz) by a very small amount and is assumed to be less than the upper frequency bound (e.g., 5 MHz) because the TDC resolution control step is very fine (e.g., 1 LSB). In some embodiments, when the TDC resolution is adjusted by large steps (e.g., by several bits at a time), then after block 305 is satisfied (e.g., after the PLL bandwidth increases above 2 MHz), apparatus 102 checks whether PLL bandwidth is below the upper bound (e.g., 5 MHz) as indicated by the dotted arrowed line.

As discussed with reference to block 303, if apparatus 102 makes a determination that the amplitude of the output of TDC 101a is greater than 70% of the amplitude of the digital code from apparatus 102, the process proceeds to block 304. At block 304, apparatus 102 applies (i.e., injects or subtracts) steps or 'N' pulses of second frequency (e.g., 5 MHz or 200 ns) to mixing node 101b to determine whether the PLL bandwidth is above or below the upper frequency bound. Here, the second frequency is the upper frequency bound of the PLL bandwidth range. The second frequency indicates how often apparatus 102 switches between injecting (e.g., adding) and removing (e.g., subtracting) of the digital code from the digital output code of TDC 101a at mixing node 101b.

At block 306, apparatus 102 makes a determination whether the amplitude of the digital output code of TDC 101a is less than a second threshold of an input amplitude. Here, the second threshold is 0.7 (i.e., 70% of the input amplitude) and the input amplitude is the amplitude of the digital code from apparatus 102, in accordance with some embodiments. If apparatus 102 makes a determination that the amplitude of the digital output code of TDC 101a is less than 70% of the amplitude of the digital code from apparatus 102, the process proceeds to block 308. Otherwise, the process proceeds to block 307. At block 307, the resolution of TDC 101a is adjusted over a number of iterations of adding and subtracting the digital code to mixing node 101b.

For example, after 'M' iterations of comparing the amplitude of TDC output and adjusting of TDC resolution, the output of TDC 101a becomes less than or equal to 70% of the amplitude of the digital code from apparatus 102. One example of sub-flowchart inside block 307 is shown by blocks 307a, 307b, and 307c.

At block 307a, apparatus 102 adjusts the resolution of TDC 101a. At block 307b, apparatus 102 applies (e.g., injects or subtracts) steps or 'N' pulses of the second frequency (e.g., 5 MHz or 200 ns) to mixing node 101b. At block 307c, apparatus 102 makes a determination whether the amplitude of TDC output is less than 70% (i.e., second threshold) of the amplitude of the digital code from apparatus 102. If the amplitude of the digital output code from TDC 101a is greater than 70% of the amplitude of the digital code from apparatus 102, the process proceeds to block 307a. Otherwise, the process proceeds to block 308. As such, the PLL bandwidth is now between the lower frequency bound (e.g., 2 MHz) and the upper frequency bound (e.g., 5 MHz).

Figure 4:
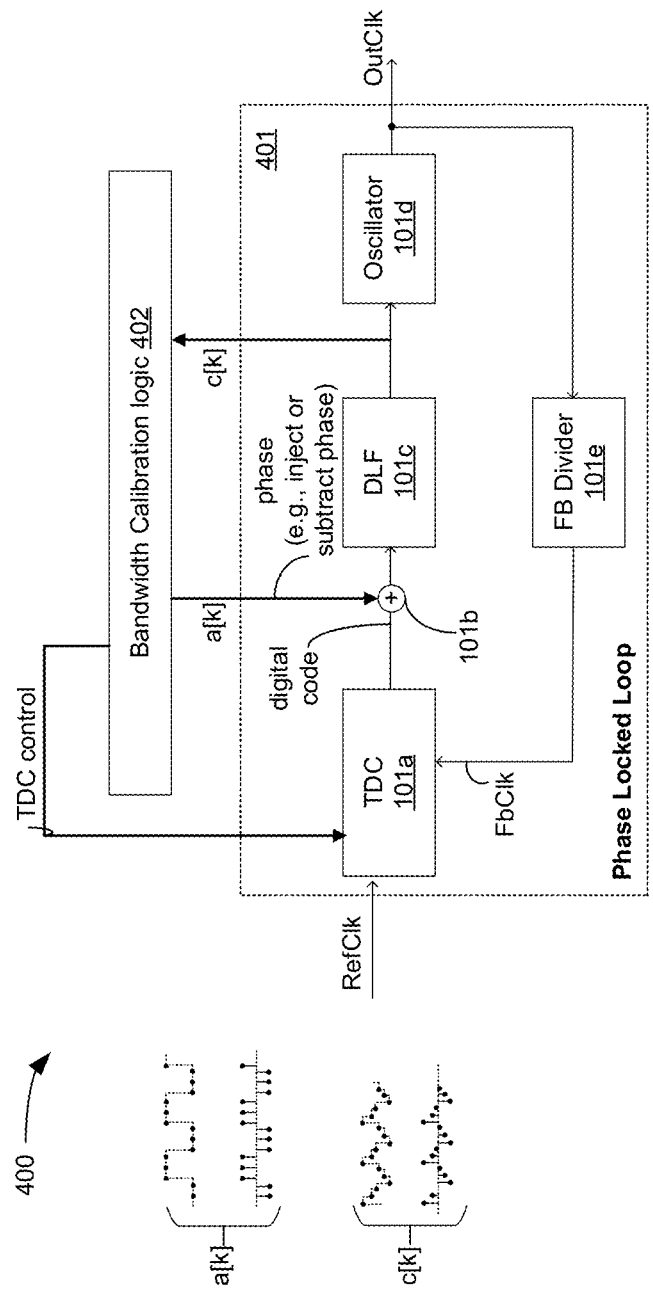
FIG. 4 illustrates a high level schematic of a PLL controlled by an apparatus for bandwidth calibration based on an output of a Digital Loop Filter (DLF), according to some embodiments of the disclosure.

FIG. 4 illustrates a high level block schematic 400 with a PLL controlled by an apparatus for bandwidth calibration based on an output of a DLF, according to some embodiments of the disclosure. It is pointed out that those elements of FIG. 4 having the same reference numbers (or names) as the elements of any other figure can operate or function in any manner similar to that described, but are not limited to such.

In some embodiments, schematic 400 comprises PLL 401 and apparatus 402. Here, PLL 401 is the same as PLL 101 except for the interface signals. In PLL 401, the output of DLF 101c is provided to apparatus 402 while in PLL 101 the output of TDC 101a is provided to apparatus 102. Apparatus 402 is different from apparatus 102 in that apparatus 402 is capable of monitoring the output of DLF 101c instead of monitoring the output of TDC 101a.

In some embodiments, apparatus 402 applies a phase step to mixing node 101b. At mixing node 101b, the phase step from apparatus 402 is added or subtracted from the digital output code of TDC 101a. As such, the input to DLF 101c is phase modulated. Here, the phase step applied by apparatus 402 may also refer to as phase step modulating signal or pulses of phase modulating signals. In some embodiments, apparatus 402 applies the phase step during PLL reset or startup phase.

In some embodiments, after apparatus 402 applies the phase step or pulses of phases a[k], the closed loop of PLL 401 corrects the inserted phase (such that the phase of RefClk and FbClk are aligned), and the response of PLL 401 is observed by apparatus 402 at the output of DLF 101c. Since the output c[k] of DLF 101c represents frequency, not phase, theoretically the changes of the DLF output is integrated for phase comparison. Such integration is computation wise expensive and error prone. In some embodiments, apparatus 402 checks the overlap in the output of DLF 101c over two different frequencies (e.g., lower frequency bound and upper frequency bound) of the digital code from apparatus 102.

FIGS. 5A-B illustrate the overlap check based on an approximate triangular DLF output model. FIGS. 5A-B illustrate plots 500 and 520, respectively, showing DLF output patterns with low and high modulation frequencies, in accordance with some embodiments. Plot 500 illustrates the case with two non-overlapping triangles which are output of DLF 101c. The area under the triangles indicates the amount of phase error corrected. Calculating areas is generally complicated and error prone. Plot 520 illustrates the case with two overlapping triangles which are output of DLF 101c. In this case, PLL bandwidth is not high enough to cancel or correct the phase error, which results in overlapping triangles.

At a low modulation frequency (e.g., when apparatus 402 applies a phase step or phase pulses with first frequency at mixing node 101b), PLL 401 corrects the inserted phase by adjusting frequency, and then the PLL frequency comes back to the original value before the next phase step, as shown in FIG. 5A. At a high modulation frequency (e.g., when apparatus 402 applies a phase step or phase pulses with a second frequency at mixing node 101b), in this example, PLL 401 cannot correct the phase error before the next phase step, thus the DLF output pattern makes an overlap as shown with reference to FIG. 5B.

In some embodiments, apparatus 402 performs the overlap check in which the relative amplitude of the overlap (e.g., B/A) in FIG. 5B, is monitored, where 'A' is height of the overlapped triangle, and 'B' is amplitude of the overlapped part. Based on a simplified triangular model, the area under the triangle is reduced by approximately 30% at the −3 dB cut-off frequency, where 'A' and 'B' become 85% and 15% of the original triangle height, respectively.

In some embodiments, apparatus 402 uses this triangle model to determine whether the bandwidth of PLL 401 is above or below a target range (e.g., between 2 MHz and 5 MHz). In some embodiments, apparatus 402 applies the low-end and high-end of a target bandwidth range and checks if "B/A" is lower and higher than 0.18 (i.e., 15%/85%) at those modulation frequencies. The threshold of 0.18 can be configured to a different ratio, in accordance with some embodiments. For example, the threshold ratio can be programmed by software, firmware, and/or hardware to different ratios to adjust the PLL bandwidth range.

In some embodiments, the area under the triangles can be calculated with the integration of differences between DFL outputs between two clock cycles (i.e., ΔDLF_output). The integration, however, may require a reference value to calculate the difference Δ, and a small error can cause significant impact since the error in the reference value is also integrated in the calculation.

Figure 6:
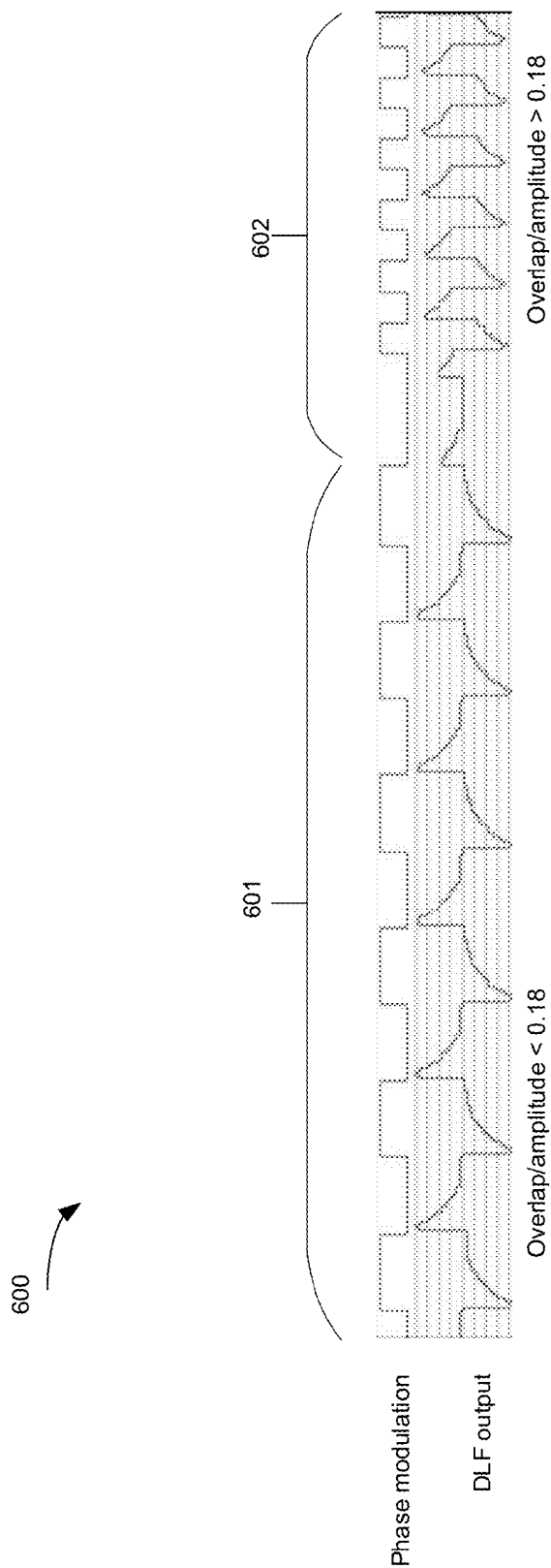
FIG. 6 illustrates a plot showing an output of the DLF when a phase modulation signal with different frequencies is injected at the output of TDC.

FIG. 6 illustrates plot 600 showing an output of DLF 101c when a digital code with different frequencies from apparatus 402 is applied to mixing node 101b. It is pointed out that those elements of FIG. 6 having the same reference numbers (or names) as the elements of any other figure can operate or function in any manner similar to that described, but are not limited to such.

Here, two sections are shown—601 and 602. Section 601 is the section where the first frequency phase modulation is applied by apparatus 402 to mixing node 101b. In this section, PLL bandwidth is higher than the first frequency, and the inserted phase is corrected before the next phase step. In this case, the DLF output (frequency code) comes back to the original value, and there is no overlap between the triangles.

Section 602 is the section where the second frequency phase modulation is applied by apparatus 402 to mixing phase node 101b. In this section, PLL bandwidth is lower than the second frequency, and the inserted phase is not corrected before the next phase step. In this case, the DLF output (frequency code) may not come back to the original value, and there is overlap between triangles. Here, the first frequency is lower than the second frequency. For example, the first frequency is 2 MHz and the second frequency is 5 MHz.

Figure 7:
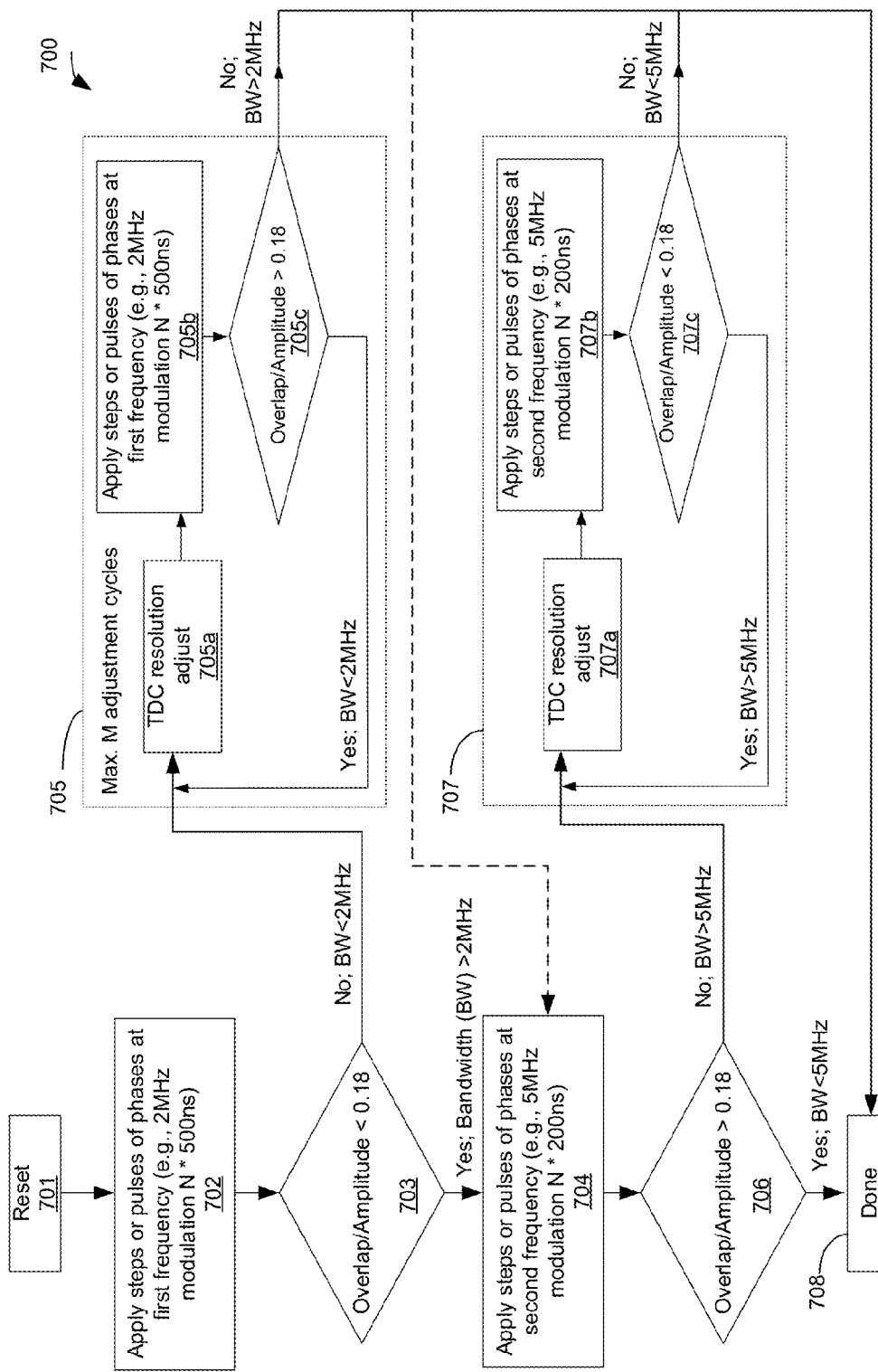
FIG. 7 illustrates a flowchart of a method for calibrating bandwidth of a PLL based on the output of the DLF, according to some embodiments of the disclosure.

FIG. 7 illustrates flowchart 700 of a method for calibrating bandwidth of PLL 401 based on the output of the DLF 101c, according to some embodiments of the disclosure. It is pointed out that those elements of FIG. 7 having the same reference numbers (or names) as the elements of any other figure can operate or function in any manner similar to that described, but are not limited to such.

Although the blocks in the flowchart with reference to FIG. 7 are shown in a particular order, the order of the actions can be modified. Thus, the illustrated embodiments can be performed in a different order, and some actions/blocks may be performed in parallel. Some of the blocks and/or operations listed in FIG. 7 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Flowchart 700 illustrates a method of PLL bandwidth calibration using schematic 400 in which apparatus 402 monitors the output of DLF 101c. The example described with reference to FIG. 7 is applicable for PCIe Gen3. However, flowchart 700 can work with other technologies and standards, and is not limited to PCIe Gen3. In flowchart 700, 'N' is the number of modulation cycles repeated to average the noise in RefClk, and 'M' is the number of corrections of resolution of TDC 101a to calibrate the bandwidth within two input frequencies—a first frequency (i.e., lower frequency bound) and a second frequency (i.e., upper frequency bound).

Flowchart 700 can be used for PLL architectures where the resolution of TDC 101a is not fine enough compared to the modulated phase amplitude, in accordance with some embodiments. In this example, the non-linearity of TDC 101a is less impactful than described with reference to FIG. 1 and flowchart 300, since the overlap check described with reference to FIGS. 4-6 takes DLF codes resulting from multiple TDC measurements, thus averaging the non-linear contribution of the TDC measurements.

Referring back to FIG. 7, at block 701, apparatus 402 determines whether PLL 401 or processor is being reset. For example, apparatus 402 can calibrate the bandwidth when PLL 401 is being reset. At block 702, apparatus 402 applies a pulse or step signal at first frequency (e.g., 2 MHz). For example, an 'N' number of pulses of a period of 500 ns each are applied to mixing node 101b and PLL 401 in closed loop is allowed to relock or resettle (such that the input of the DLF 103c becomes substantially zero). Here, the first frequency is the lower frequency bound of the PLL bandwidth range. The first frequency indicates how often apparatus 402 switches between injecting (e.g., adding) and removing (e.g., subtracting) of the digital code from the digital output code of TDC 101a at mixing node 101b.

At block 703, apparatus 402 makes a determination whether the Overlap/Amplitude is less than a threshold (e.g., 0.18 which corresponds to 70% of the area which in turn translates to −3 dB point on the bandwidth scale). For example, with reference to FIG. 5B, apparatus 402 computes the ratio of triangle heights 'B' over 'A' and checks whether that ratio is less than 0.18.

Referring back to FIG. 7, if apparatus 402 makes a determination whether the Overlap/Amplitude is less than a threshold (e.g., 0.18), the process proceeds to block 704. Otherwise, the process proceeds to block 705. At block 705, the resolution of TDC 101a is adjusted over a number of iterations of adding and subtracting the digital code to mixing node 101b.

For example, after 'M' iterations of comparing Overlap/Amplitude against the threshold (e.g., 0.18) and adjusting of TDC resolution, the Overlap/Amplitude (e.g., B/A) becomes less than the threshold. One example of sub-flowchart inside block 705 is shown by blocks 705a, 705b, and 705c.

At block 705a, apparatus 402 adjusts the resolution of TDC 101a. At block 705b, apparatus 402 applies (e.g., injects and subtracts) steps or 'N' cycles of pulses of the first frequency (e.g., 2 MHz or 500 ns) to mixing node 101b. At block 705c, apparatus 402 makes a determination whether the Overlap/Amplitude (e.g., ratio of 'B' over 'A') is greater than the threshold (e.g., 0.18). If the Overlap/Amplitude is greater than the threshold, the process proceeds to block 705a. Otherwise, the process proceeds to block 708.

In some embodiments, when the TDC resolution is adjusted by very fine steps (e.g., by a small fraction of current resolution), then once block 705 completes and the process reaches block 708, the PLL bandwidth is considered to be above the lower frequency bound (e.g., 2 MHz) by a very small amount and is assumed to be less than the upper bound (e.g., 5 MHz) because the TDC resolution control is very fine (e.g., 1 LSB). In some embodiments, when the TDC resolution is adjusted by large steps (e.g., by several bits at a time), then after block 705 is satisfied (e.g., after the PLL bandwidth increases above 2 MHz), apparatus 402 checks whether the PLL bandwidth is below the upper bound (e.g., 5 MHz) as indicated by the dotted line arrow from blocks 705 to 704.

At block 704, apparatus 402 applies (i.e., injects and/or subtracts) steps or 'N' cycles of pulses of second frequency (e.g., 5 MHz or 200 ns) to mixing node 101b to determine whether the PLL bandwidth is above or below the upper frequency bound. Here, the second frequency is the upper frequency bound of the PLL bandwidth range. The second frequency indicates how often apparatus 402 switches between injecting (e.g., adding) and removing (e.g., subtracting) of the digital code from the digital output code of TDC 101*a* at mixing node 101*b*.

At block 706, apparatus 102 makes a determination whether Overlap/Amplitude (e.g., ratio of triangle heights) is greater than a second threshold (e.g., 0.18). For example, with reference to FIG. 5B, apparatus 402 computes the ratio of 'B' over 'A' and checks whether that ratio is greater than 0.18.

Referring back to FIG. 7, if apparatus 402 makes a determination whether the Overlap/Amplitude (e.g., ratio of 'B' over 'A') is greater than a threshold (e.g., 0.18), the process proceeds to block 708. Otherwise, the process proceeds to block 707. At block 707, resolution of TDC 101*a* is adjusted over a number of iterations. For example, after 'M' iterations of comparing Overlap/Amplitude (e.g., ratio of 'B' over 'A') against the threshold (e.g., 0.18) and adjusting of TDC resolution, the Overlap/Amplitude becomes greater than or equal to the threshold. One example of sub-flowchart inside block 707 is shown by blocks 707*a*, 707*b*, and 707*c*.

At block 707*a*, apparatus 402 adjusts the resolution of TDC 101*a*. At block 707*b*, apparatus 402 applies (e.g., injects and/or subtracts) steps or 'N' pulses of the second frequency (e.g., 5 MHz or 200 ns) to mixing node 101*b*. At block 707*c*, apparatus 402 makes a determination whether the Overlap/Amplitude is less than the threshold. If the Overlap/Amplitude is less than the threshold, the process proceeds to block 707*a*. Otherwise, the process proceeds to block 708. As such, the PLL bandwidth is now between the lower frequency bound (e.g., 2 MHz) and the upper frequency bound (e.g., 5 MHz).

As shown in flowchart 700, PCIe Gen3 with 100 MHz reference clock frequency, for example, takes (500 ns*N)*M1+(200 ns*N)*M2, where 'N' is number of modulation cycles to average reference clock noise, "M1"=1+#correction1 (0 or higher), and "M2"=#correction2 (0 or higher). According to flowchart 700, the first frequency is applied at least once, and it may be applied over one or more iterations to adjust the PLL bandwidth, thus "M1"=1+#correction1 (0 or higher). On the other hand, the second frequency may not be applied depending on the previous step. Thus, "M2"=#correction2 (0 or higher). While it depends on the reference clock noise level and target adjustment range, the calibration time is low enough to be applied at every reset, in accordance with some embodiments.

In some embodiments, the −3 dB cutoff bandwidth triggered by square-wave modulation in RefClk is higher than the bandwidth triggered by sinusoidal modulation. The correlation between bandwidths to square-wave and sinusoidal modulations can be obtained based on a transfer function of the PLL, and, in some embodiments, the adjustment can be applied to low-end and high-end modulation frequencies through configuration.

For example, a PLL may correct 70% (e.g., −3 dB) of the injected square phase amplitude at frequency 'A' or lower, while the same PLL can correct 70% of the injected sinusoidal phase amplitude at frequency 'B' or lower, where 'A' is greater than 'B'. In this case, the target PLL bandwidth range (e.g., difference between low-end and high-end frequencies), can be adjusted to address the difference between the phase modulation types.

Figure 8:
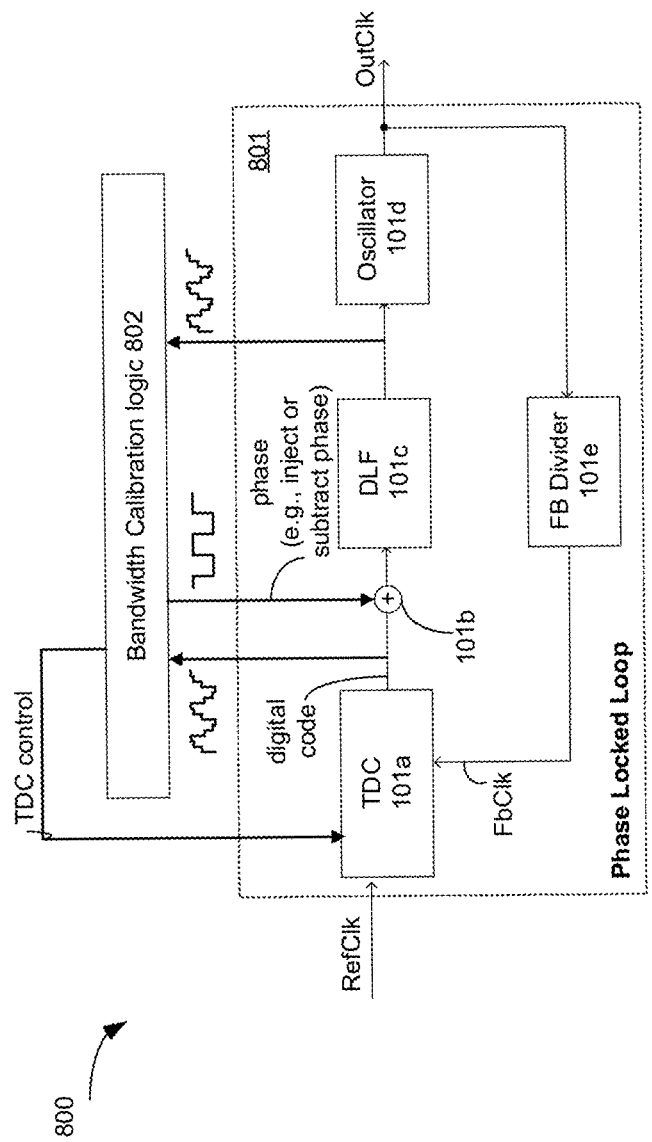
FIG. 8 illustrates a high level schematic of a PLL controlled by an apparatus for bandwidth calibration based on outputs of a TDC and DLF, according to some embodiments of the disclosure.

FIG. 8 illustrates a high level block schematic 800 with a PLL controlled by an apparatus for bandwidth calibration based on an outputs of TDC 101*a* and DLF 101*c*, according to some embodiments of the disclosure. It is pointed out that those elements of FIG. 8 having the same reference numbers (or names) as the elements of any other figure can operate or function in any manner similar to that described, but are not limited to such.

In some embodiments, schematic 800 comprises PLL 801 and apparatus 802. PLL 801 is same as PLL 101 except for the interface signals. In PLL 801, outputs of TDC 101*a* and DLF 101*c* are provided to apparatus 802 while in PLL 101 the output of TDC 101*a* is provided to apparatus 102. Apparatus 802 is different from apparatus 102 in that apparatus 802 is capable of monitoring the outputs of TDC 101*a* and DLF 101*c* instead of monitoring the output of TDC 101*a*. In some embodiments, apparatus 802 is a combination of apparatuses 101 and 401. In some embodiments, apparatus 802 is operable to perform the functions of apparatuses 102 and 402, and the methods of flowcharts 300 and 700.

Figure 9A:
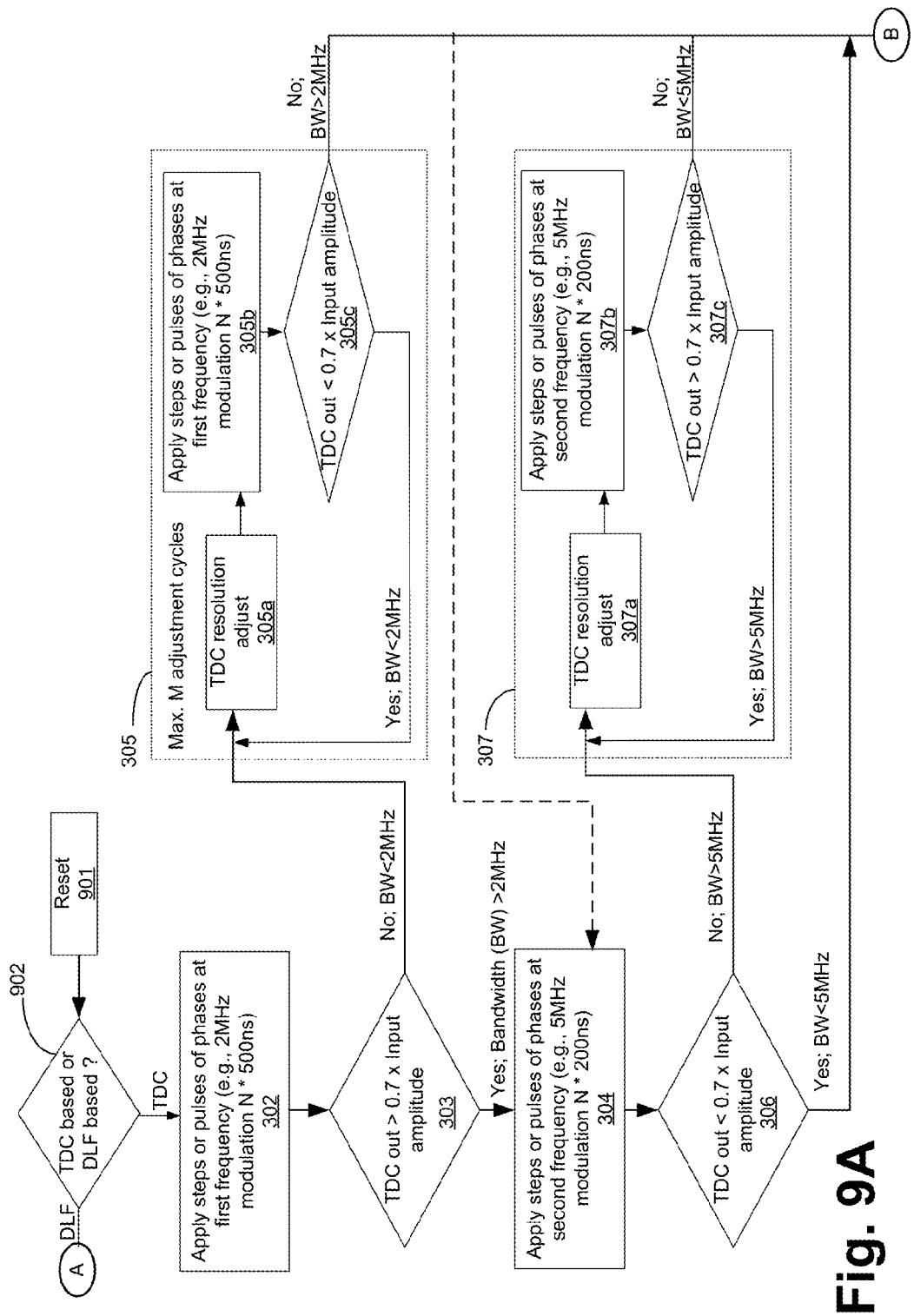
FIGS. 9A-B illustrate a flowchart of a method for calibrating bandwidth of a PLL based on the outputs of the TDC and DLF, according to some embodiments of the disclosure.
Figure 9B:
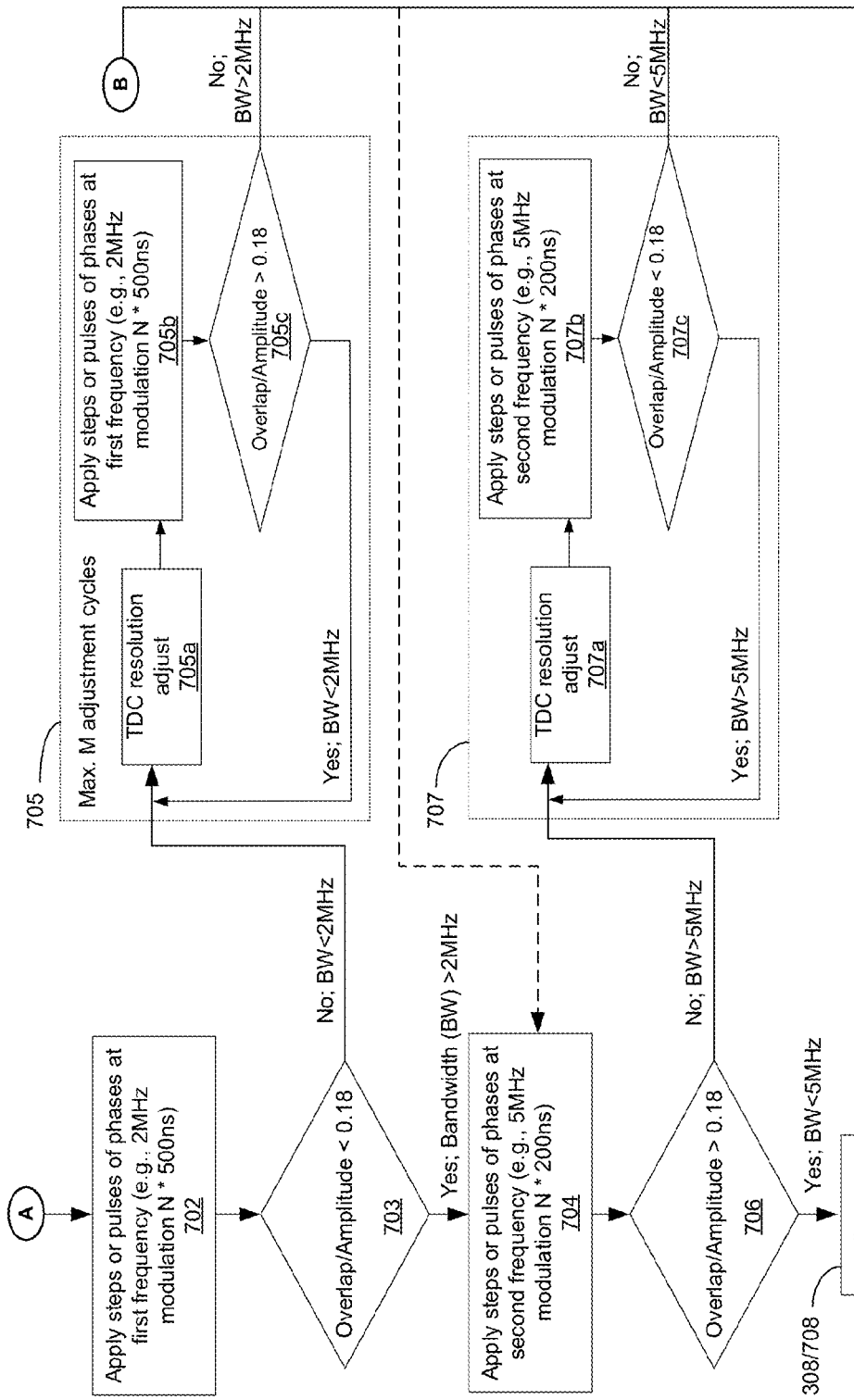

FIGS. 9A-B illustrate flowchart 900 of a method for calibrating bandwidth of a PLL based on the outputs of the TDC and DLF, according to some embodiments of the disclosure. It is pointed out that those elements of FIGS. 9A-B having the same reference numbers (or names) as the elements of any other figure can operate or function in any manner similar to that described, but are not limited to such.

Although the blocks in the flowchart with reference to FIGS. 9A-B are shown in a particular order, the order of the actions can be modified. Thus, the illustrated embodiments can be performed in a different order, and some actions/blocks may be performed in parallel. Some of the blocks and/or operations listed in FIGS. 9A-B are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 901, apparatus 802 determines whether PLL 801 or processor is being reset. For example, apparatus 802 can calibrate the bandwidth when PLL 801 is being reset. At block 902, apparatus 802 makes a determination whether a TDC based PLL bandwidth calibration is the preferred method or whether a DLF based PLL bandwidth calibration is the preferred method. If the TDC based method is selected, then the process proceeds to block 302 and performs bandwidth calibrations as described with reference to FIG. 3. Here, connector 'B' indicates a completion of the TDC based method. Referring back to FIG. 9, if the DLF based method is selected, then the process proceeds to block 702, as indicated by connector 'A,' and as described with reference to FIG. 7.

Figure 10A:
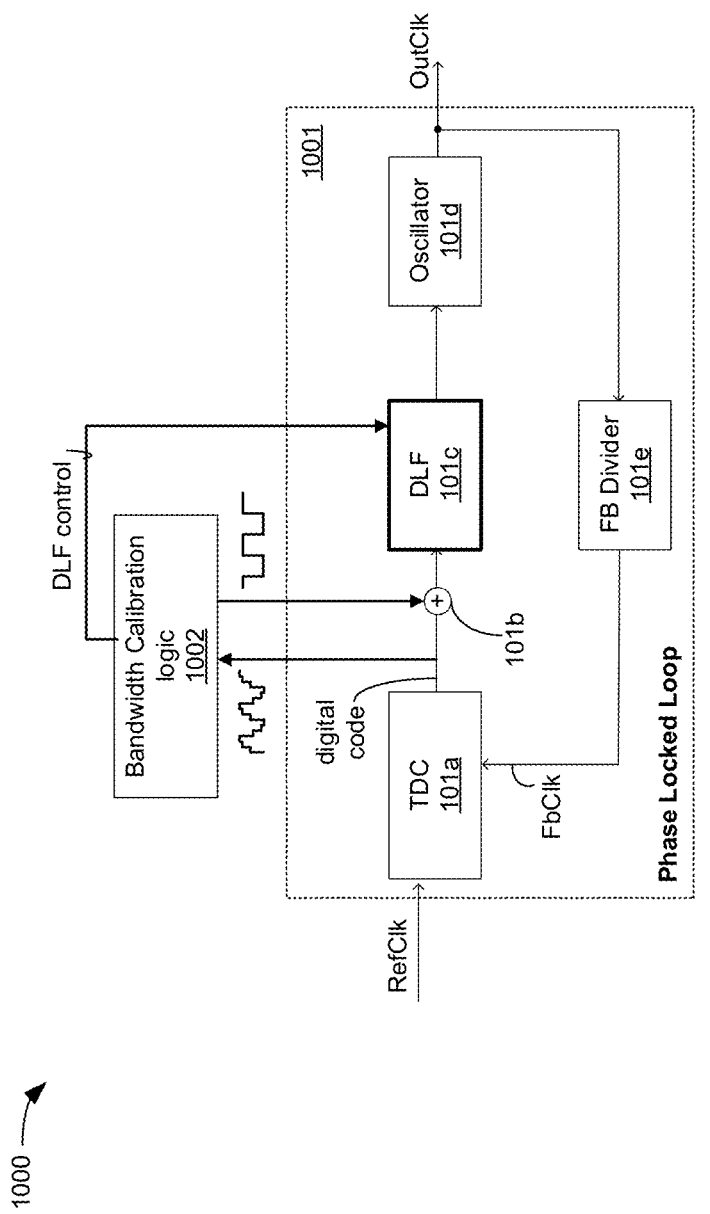
FIG. 10A illustrates a high level schematic of a PLL controlled by an apparatus for bandwidth calibration based on an output of a TDC, where the apparatus is to adjust filter coefficients of a DLF, according to some embodiments of the disclosure.

FIG. 10A illustrates a high level schematic 1000 of a PLL controlled by an apparatus for bandwidth calibration based on an output of a TDC, where the apparatus is to adjust filter coefficients of a DLF, according to some embodiments of the disclosure. It is pointed out that those elements of FIG. 10A having the same reference numbers (or names) as the elements of any other figure can operate or function in any manner similar to that described, but are not limited to such.

In some embodiments, the PLL bandwidth can be adjusted not only by adjusting the TDC resolution, but it can be also adjusted by the DLF coefficients. In some embodiments, schematic 1000 comprises PLL 1001 and apparatus 1002. PLL 1001 is the same as PLL 101 except for the interface signals. In PLL 1001, the output of TDC 101*a* is provided to apparatus 1002 and DFL 101*c* coefficients are adjusted by DLF control signal from apparatus 1002, while in PLL 101 the output of TDC 101*a* is provided to apparatus 102 and the TDC control signal is received by TDC 101*a* to control its resolution. In some embodiments, apparatus 1002 is different from apparatus 102 in that apparatus 1002 is capable of monitoring the output of TDC 101*a* and controlling the coefficients of DLF 101*c* instead of controlling the resolution of TDC 101*a*.

In some embodiments, apparatus 1002 combines the functions and features of apparatus 802 (i.e., apparatuses 102 and 402). As such, in some embodiments, apparatus 1002 is operable to adjust the bandwidth of PLL 1001 by monitoring the outputs of TDC 101*a* and DLF 101*c*, and by controlling the resolution of TDC 101*a* and/or controlling/adjusting the DLF coefficients via DLF control signal(s). In some embodiments, the DLF control signals are a digital code.

Figure 10B:
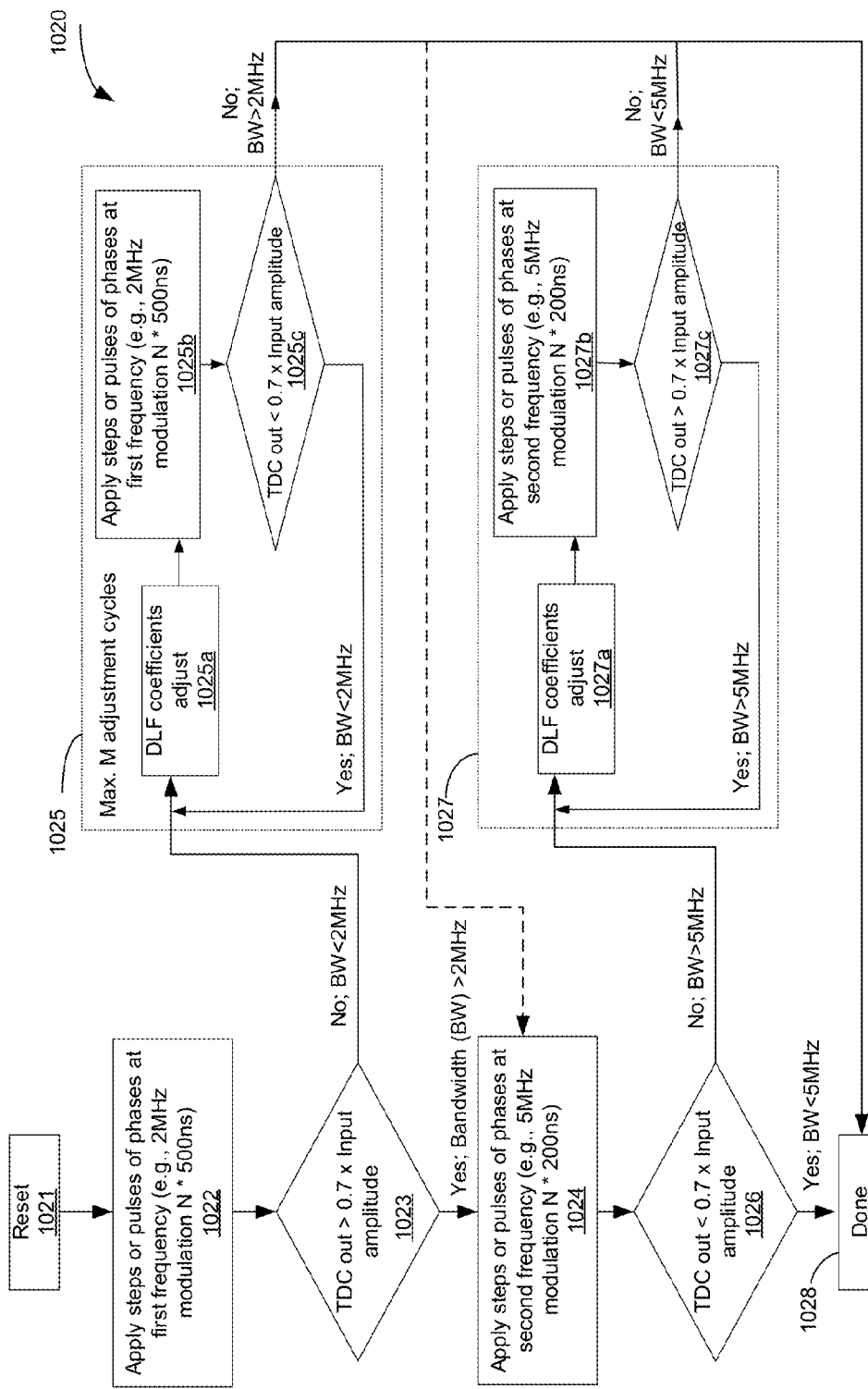
FIG. 10B illustrates a flowchart of a method for calibrating bandwidth of a PLL based on the output of a TDC, according to some embodiments of the disclosure.

FIG. 10B illustrates flowchart 1020 of a method for calibrating bandwidth of a PLL based on the output of a TDC, according to some embodiments of the disclosure. It is pointed out that those elements of FIG. 10B having the same reference numbers (or names) as the elements of any other figure can operate or function in any manner similar to that described, but are not limited to such.

Although the blocks in the flowchart with reference to FIG. 10B are shown in a particular order, the order of the actions can be modified. Thus, the illustrated embodiments can be performed in a different order, and some actions/blocks may be performed in parallel. Some of the blocks and/or operations listed in FIG. 10B are optional in accordance with certain embodiments. The numbering of the blocks presented is for the sake of clarity and is not intended to prescribe an order of operations in which the various blocks must occur. Additionally, operations from the various flows may be utilized in a variety of combinations. FIG. 10B is described with reference to FIG. 10A.

At block 1021, apparatus 1002 determines whether PLL 1001 or processor is being reset. For example, apparatus 1002 can calibrate the bandwidth when PLL 1001 is being reset. At block 1022, apparatus 1002 applies a pulse or step signal at first frequency (e.g., 2 MHz). For example, an 'N' number of pulses of a period of 500 ns each are applied to mixing node 101*b*, and PLL 1001 in closed loop is allowed to relock or resettle (such that the input of the DLF 103*c* becomes substantially zero). Here, the first frequency is the lower frequency bound of the PLL bandwidth range. The first frequency indicates how often apparatus 1002 switches between injecting (e.g., adding) and removing (e.g., subtracting) of the digital code from the digital output code of TDC 1001*a* at mixing node 101*b*.

At block 1023, apparatus 1002 makes a determination whether the amplitude of the digital output code of TDC 101*a* is greater than a threshold of an input amplitude. Here, the threshold is 0.7 (i.e., 70% of the input amplitude) and the input amplitude is the amplitude of the digital code input to mixing node 101*b* by apparatus 1002. If apparatus 1002 makes a determination that the amplitude of the output of TDC 101*a* is greater than 70% of the amplitude of the digital code from apparatus 1002, the process proceeds to block 1024. Otherwise, the process proceeds to block 1025. At block 1025, coefficients of DLF 101*c* are adjusted via DLF control signal. By adjusting the DLF coefficients, the filter cut off frequency is adjusted (e.g., the bandwidth of DLF 101*c* is adjusted).

In some embodiments, after 'M' iterations of comparing the amplitude of TDC output and adjusting coefficients of DLF 101*c*, the output of TDC 101*a* becomes greater than or equal to 70% of the amplitude of the digital code from apparatus 1002. One example of sub-flowchart inside block 1025 is shown by blocks 1025*a*, 1025*b*, and 1025*c*.

At block 1025*a*, apparatus 1002 adjusts the coefficients of DLF 101*c*. At block 1025*b*, apparatus 1002 applies (e.g., injects and subtracts) steps or 'N' pulses at first frequency (e.g., 2 MHz or 500 ns) to mixing node 101*b*. At block 1025*c*, apparatus 1002 makes a determination whether the amplitude of the TDC digital output code is less than 70% (i.e., first threshold) of the amplitude of the digital code from apparatus 1002. If the amplitude of the digital output code from TDC 101*a* is less than 70% of the amplitude of the digital code from apparatus 1002, the process proceeds to block 1025*a*. Otherwise, the process proceeds to block 1028.

In some embodiments, when the coefficients of DLF 101*c* are adjusted by very fine steps (e.g., the filter cut-off frequency or behavior is adjusted by a small fraction of the current filter cut-off frequency), then once block 1025 completes and the process reaches block 1028, the PLL bandwidth is considered to be above the lower frequency bound (e.g., 2 MHz) by a very small amount and is assumed to be less than the upper frequency bound (e.g., 5 MHz) because the coefficients of DLF 101*c* are adjusted by DLF control by a very fine amount (e.g., by one lowest order coefficient). In some embodiments, when the coefficients of DLF 101*c* are adjusted by large steps (e.g., the filter cut-off frequency or behavior is adjusted by a large fraction of the current filter cut-off frequency), then after block 1025 is satisfied (e.g., after the PLL bandwidth increases above 2 MHz), apparatus 1002 checks whether the PLL bandwidth is below the upper bound (e.g., 5 MHz) as indicated by the dotted arrowed line.

As discussed with reference to block 1023, if apparatus 1002 makes a determination that the amplitude of the output of TDC 101*a* is greater than 70% of the amplitude of the digital code from apparatus 102, the process proceeds to block 1024. At block 1024, apparatus 1002 applies (i.e., injects or subtracts) steps or 'N' pulses of second frequency (e.g., 5 MHz or 200 ns) to mixing node 101*b* to determine whether the PLL bandwidth is above or below the upper frequency bound. Here, the second frequency is the upper frequency bound of the PLL bandwidth range. The second frequency indicates how often apparatus 1002 switches between injecting (e.g., adding) and removing (e.g., subtracting) of the digital code from the digital output code of TDC 101*a* at mixing node 101*b*.

At block 1026, apparatus 1002 makes a determination whether the amplitude of the digital output code of TDC 101*a* is less than a second threshold of an input amplitude. Here, the second threshold is 0.7 (i.e., 70% of the input amplitude) and the input amplitude is the amplitude of the digital code from apparatus 1002, in accordance with some embodiments. If apparatus 1002 makes a determination that the amplitude of the digital output code of TDC 101*a* is less than 70% of the amplitude of the digital code from apparatus 1002, the process proceeds to block 1028. Otherwise, the process proceeds to block 1027. At block 1027, the coefficients of DLF 101*c* are adjusted via DLF control signal. By adjusting the DLF coefficients, the filter cut off frequency is adjusted (e.g., the bandwidth of DLF 101*c* is adjusted).

In some embodiments, after 'M' iterations of comparing the amplitude of the TDC output and adjusting coefficients of DLF 101*c*, the output of TDC 101*a* becomes less than or equal to 70% of the amplitude of the digital code from apparatus 1002. One example of sub-flowchart inside block 1027 is shown by blocks 1027*a*, 1027*b*, and 1027*c*.

At block 1027*a*, apparatus 1002 adjust the coefficients of DLF 101*c*. At block 1027*b*, apparatus 1002 applies (e.g., injects or subtracts) steps or 'N' pulses of the second frequency (e.g., 5 MHz or 200 ns) to mixing node 101*b*. At block 1027*c*, apparatus 1002 makes a determination whether the amplitude of TDC output is less than 70% (i.e., second threshold) of the amplitude of the digital code from apparatus 1002. If the amplitude of the digital output code from TDC 101a is greater than 70% of the amplitude of the digital code from apparatus 1002, the process proceeds to block 1027a. Otherwise, the process proceeds to block 1028. As such, the PLL bandwidth is now between the lower frequency bound (e.g., 2 MHz) and the upper frequency bound (e.g., 5 MHz).

Figure 11A:
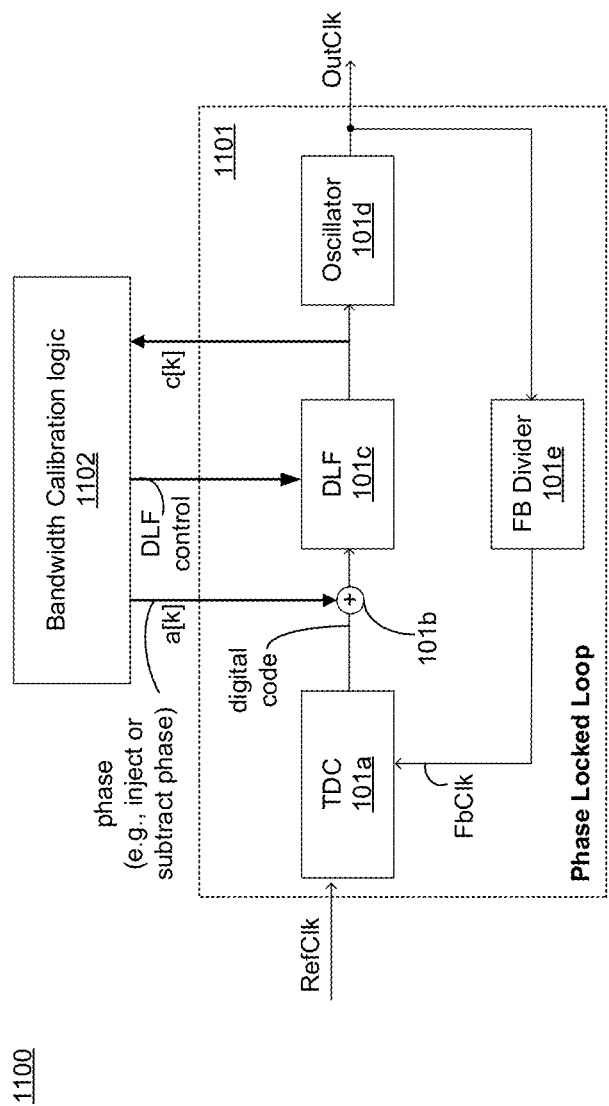
FIG. 11A illustrates a high level schematic of a PLL controlled by an apparatus for bandwidth calibration based on an output of a DLF, where the apparatus is to adjust DLF coefficients, according to some embodiments of the disclosure.

FIG. 11A illustrates a high level schematic 1100 of a PLL controlled by an apparatus for bandwidth calibration based on an output of a DLF, where the apparatus is to adjust coefficients of the DLF, according to some embodiments of the disclosure. It is pointed out that those elements of FIG. 11A having the same reference numbers (or names) as the elements of any other figure can operate or function in any manner similar to that described, but are not limited to such.

In some embodiments, the PLL bandwidth can be adjusted not only by adjusting TDC resolution, but it can be also adjusted by adjusting DCO loading conditions (e.g., capacitance, resistance, etc.) to adjust the coefficients of DLF 101c.

In some embodiments, schematic 1100 comprises PLL 1101 and apparatus 1102. Here, PLL 1101 is substantially the same as PLL 401 except for the interface signals. In some embodiments, in PLL 1101, the output of DLF 101c is provided to apparatus 1102 and the coefficients of DLF 101c are adjusted by DCO control signal from apparatus 1102, while in PLL 401 the output of DLF 101c is provided to apparatus 402 and TDC control signal is received by TDC 101a to control its resolution.

In some embodiments, apparatus 1102 is different from apparatus 402 in that apparatus 1102 is capable of monitoring the output of TDC 101a and controlling the coefficients of DLF 101c instead of controlling the resolution of TDC 101a.

In some embodiments, apparatus 1102 combines the functions and features of apparatus 802 (i.e., apparatuses 102 and 402) and apparatus 1002. As such, in some embodiments, apparatus 1102 is operable to adjust the bandwidth of PLL 1101 by monitoring the output of TDC 101a and/or the output of DLF 101c. In some embodiments, 1102 is operable to adjust the bandwidth of PLL 1101 by controlling the resolution of TDC 101a and/or controlling/adjusting the DLF coefficients via DLF control signal(s).

Figure 11B:
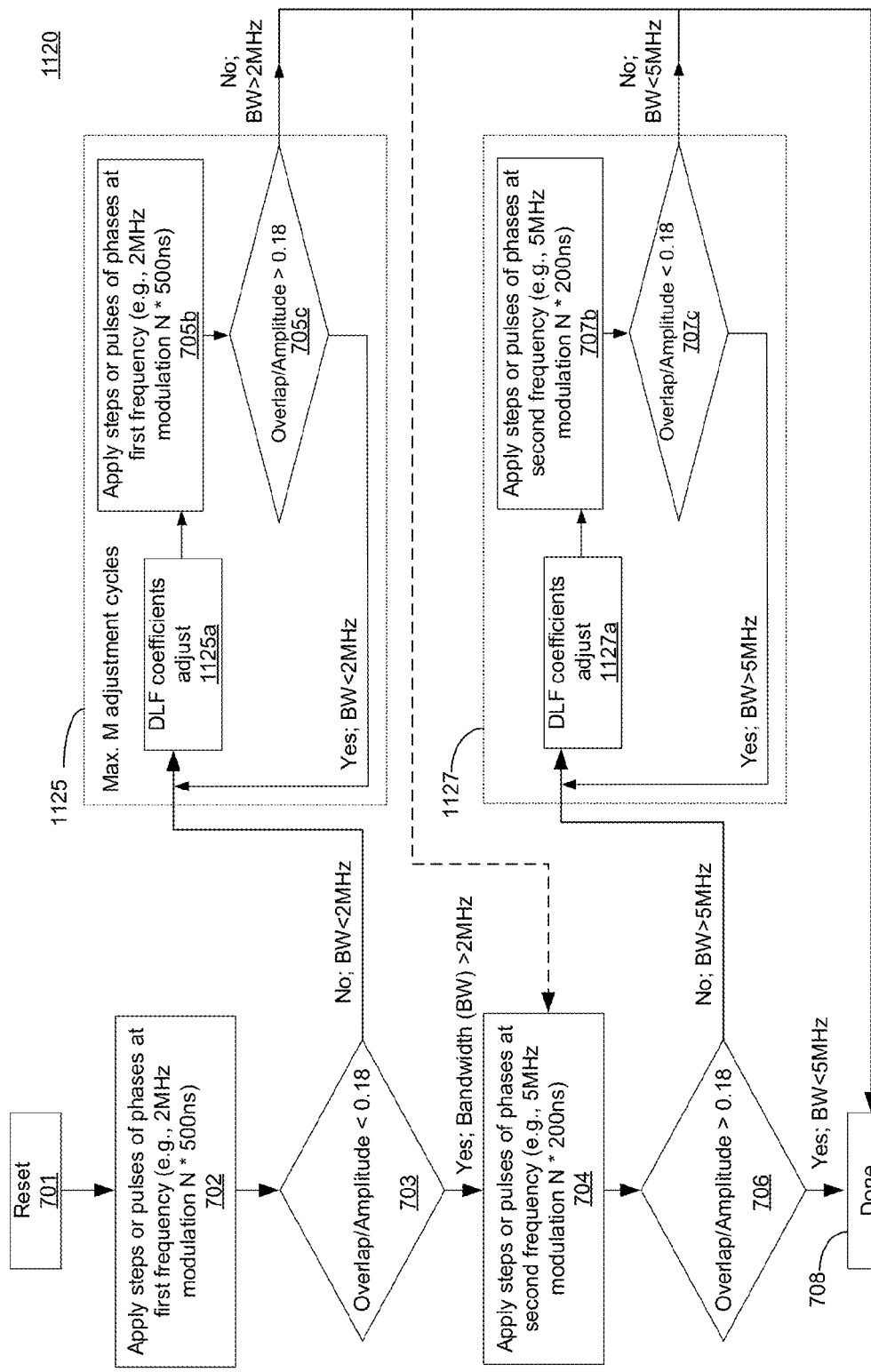
FIG. 11B illustrates a flowchart of a method for calibrating bandwidth of a PLL based on the output of a DLF, according to some embodiments of the disclosure.

FIG. 11B illustrates flowchart 1100 of a method for calibrating bandwidth of PLL 1101 based on the output of the DLF 101c, according to some embodiments of the disclosure. It is pointed out that those elements of FIG. 11B having the same reference numbers (or names) as the elements of any other figure can operate or function in any manner similar to that described, but are not limited to such.

Although the blocks in the flowchart with reference to FIG. 11B are shown in a particular order, the order of the actions can be modified. Thus, the illustrated embodiments can be performed in a different order, and some actions/blocks may be performed in parallel. Some of the blocks and/or operations listed in FIG. 11B are optional in accordance with certain embodiments. The numbering of the blocks presented is for the sake of clarity and is not intended to prescribe an order of operations in which the various blocks must occur. Additionally, operations from the various flows may be utilized in a variety of combinations.

Flowchart 1120 is similar to flowchart 700 except that block 705 is replaced with block 1125 and block 707 is replaced with block 1127. In some embodiments, block 1125 is same as block 705 except that block 705a is replaced with block 1125a. At block 1125a, coefficients of DLF 101c are adjusted (e.g., the filter cut-off frequency is adjusted one coefficient at a time). In some embodiments, block 1127 is the same as block 707 except that block 707a is replaced with block 1127a. At block 1127a, coefficients of DLF 101c are adjusted (e.g., the filter cut-off frequency is adjusted one coefficient at a time).

In some embodiments, a bandwidth control logic is provided (not shown) which combines the bandwidth control features of FIG. 8, FIG. 10A, and FIG. 11A. In some embodiments, the flowchart for such bandwidth control will be a combination of flowcharts FIGS. 9A-B and flowcharts FIG. 10B and FIG. 11B. In some embodiments, just as flowcharts of FIG. 3 and FIG. 7 are combined to form flowchart of FIGS. 9A-B, flowcharts of FIG. 10B and FIG. 11B can be combined after FIG. 9B such that FIG. 11B follows FIG. 10B and FIG. 10B follows FIG. 9B. In other embodiments, the order of FIG. 9A, FIG. 9B, FIG. 10B, and FIG. 11B may be adjusted/changed.

Figure 12:
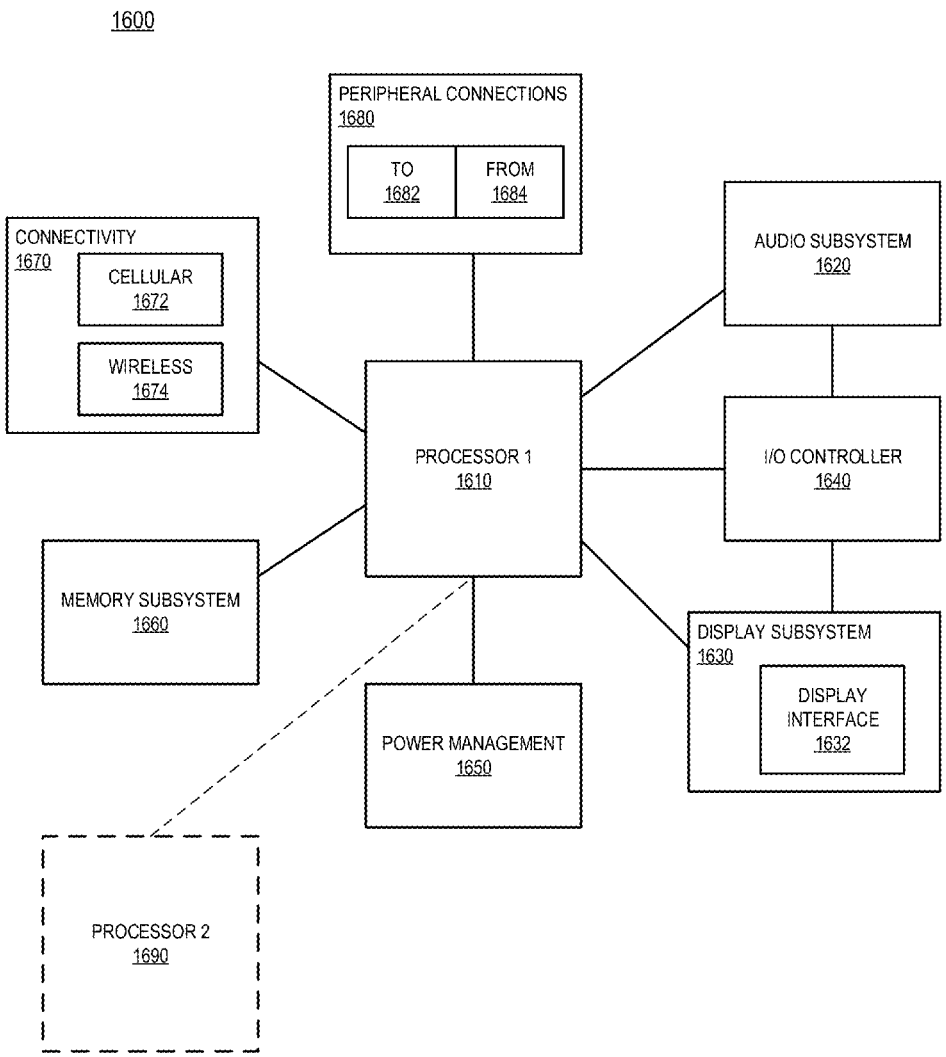
FIG. 12 illustrates a smart device or a computer system or a System-on-Chip (SoC) with apparatus to calibrate PLL bandwidth, according to some embodiments.

FIG. 12 illustrates a smart device or a computer system or a System-on-Chip (SoC) with apparatus to calibrate PLL bandwidth, according to some embodiments. It is pointed out that those elements of FIG. 12 having the same reference numbers (or names) as the elements of any other figure can operate or function in any manner similar to that described, but are not limited to such.

FIG. 12 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with apparatus to calibrate PLL bandwidth, according to some embodiments discussed. Other blocks of the computing device 1600 may also include the apparatus to calibrate PLL bandwidth, according to some embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. In some embodiments, audio subsystem 1620 includes apparatus and/or machine executable instructions to avoid self-hearing, according to some embodiments. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a time-to-digital converter (TDC) to receive a reference clock and a feedback clock, wherein the TDC is to generate a digital output code representing a time difference between the reference clock and the feedback clock; a circuitry to apply a digital code to an output of the TDC; and a node to receive the digital output code from the TDC and the digital code applied by the circuitry, wherein the circuitry is to monitor the digital output code and is to control the TDC according to at least the monitored digital output code.

In some embodiments, the digital code from the circuitry is a step signal, and wherein the circuitry is operable to apply the digital code by: adding the digital code to the digital output code at the node, or subtracting the digital code from the digital output code at the node. In some embodiments, the circuitry is operable to adjust a first frequency to a second frequency, wherein the first and second frequencies indicate how often the circuity is to switch the digital code from, being added to the digital output code at the node, to being subtracted from the digital code at the node, and wherein the first frequency is lower than the second frequency.

In some embodiments, the first frequency is at most 2 MHz, and wherein the second frequency is at least 5 MHz. In some embodiments, the circuitry is to apply, at the first frequency, the digital code, and wherein the circuitry is to then monitor an amplitude of the digital output code from the TDC to determine whether the amplitude is greater than a first threshold of an amplitude of the digital code applied by the circuitry. In some embodiments, the circuitry is to control the TDC to cause the TDC to adjust its resolution when it is determined that the amplitude of the digital output code from the TDC is less than or equal to the first threshold of the amplitude of the digital code applied by the circuitry.

In some embodiments, the circuitry is to control the TDC to cause the TDC to adjust its resolution so long as the amplitude of the digital output code from the TDC is less than the first threshold of the amplitude of the digital code applied by the circuitry. In some embodiments, the circuitry is to apply, at the second frequency, the digital code, and wherein the circuitry is to then monitor an amplitude of the digital output code from the TDC to determine whether the amplitude is greater than a second threshold of an amplitude of the digital code applied by the circuitry.

In some embodiments, the circuitry is to control the TDC to cause the TDC to adjust its resolution when it is determined that the amplitude of the digital output code from the TDC is greater than or equal to the second threshold of the digital code applied by the circuitry. In some embodiments, the circuitry is to control the TDC to cause the TDC to adjust its resolution so long as the amplitude of the digital output code from the TDC is greater than the second threshold of the digital code applied by the circuitry.

In some embodiments, the first and second thresholds are programmable. In some embodiments, the first and second thresholds are to be set at 0.7. In some embodiments, the apparatus comprises: a digital loop filter (DLF) coupled to the TDC via the node; an oscillator coupled to the DLF; and a divider coupled to the oscillator, wherein the divider is to generate the feedback clock.

In another example, a system is provided which comprises: a memory; a processor coupled to the memory, the processor including an apparatus according to the apparatus described above; and a wireless interface for allowing the processor to communicate with another device.

In another example, an apparatus is provided which comprises: a time-to-digital converter (TDC) to receive a reference clock and a feedback clock, wherein the TDC is to generate a digital output code representing a time difference between the reference clock and the feedback clock; a circuitry to apply a digital code to an output of the TDC; a node to receive the digital output code from the TDC and the digital code from the circuitry; and a digital loop filter (DLF) coupled to the TDC via the node, the DLF is to generate a filtered output, wherein the circuitry is to monitor the filtered output and is to control the TDC according to at least the monitored filtered output.

In some embodiments, the digital code from the circuitry is a step signal, and wherein the circuitry is operable to: add the digital code to the digital output code at the node, or subtract the digital code from the digital output code at the node. In some embodiments, the circuitry is operable to adjust a first frequency to a second frequency, wherein the first and second frequencies indicate how often the circuity is to switch the digital code from, being added to the digital output code at the node, to being subtracted from the digital code at the node, and wherein the first frequency is lower than the second frequency.

In some embodiments, the first frequency is at most 2 MHz, and wherein the second frequency is at least 5 MHz. In some embodiments, the circuitry is to apply, at the first frequency, the digital code, and wherein the circuitry is then operable to control a resolution of the TDC by monitoring a ratio of amplitudes of a triangular model representing the filtered output. In some embodiments, the circuitry is to determine whether the ratio is less than a threshold, and is to cause the TDC to adjust its resolution when the ratio is greater than the threshold.

In some embodiments, the circuitry is to apply, at the second frequency, the digital code, and wherein the circuitry is then operable to control a resolution of the TDC by monitoring a ratio of amplitudes of a triangular model representing the filtered output. In some embodiments, the circuitry is to determine whether the ratio is greater than a threshold, and is to cause the TDC to adjust its resolution when the ratio is less than the threshold.

In another example, a system is provided which comprises: a memory; a processor coupled to the memory, the processor including an apparatus according to the apparatus described above; and a wireless interface for allowing the processor to communicate with another device.

In another example, a system is provided which comprises: a memory; a processor coupled to the memory, the processor having a phase locked loop (PLL) which includes: a time-to-digital converter (TDC) to receive a reference clock and a feedback clock, wherein the TDC is to generate a digital output code representing a time difference between the reference clock and the feedback clock; a digital loop filter (DLF) coupled to the TDC via the node; an oscillator coupled to the DLF; and a divider coupled to the oscillator, wherein the divider is to generate the feedback clock, wherein the processor includes: a circuitry to apply a digital code to an output of the TDC; and a node to receive the digital output code from the TDC and the digital code from the circuitry, wherein the circuitry is to monitor the digital output code and to control the TDC according to at least the monitored digital output code; and a wireless interface for allowing the processor to communicate with another device.

In some embodiments, the digital code from the circuitry is a step signal, and wherein the circuitry is operable to apply the digital code by: adding the digital code to the digital output code at the node, or subtracting the digital code from the digital output code at the node. In some embodiments, the circuitry is operable to adjust a first frequency to a second frequency, wherein the first and second frequencies indicate how often the circuity is to switch the digital code from, being added to the digital output code at the node, to being subtracted from the digital code at the node, and wherein the first frequency is lower than the second frequency.

In another example, a method is provided which comprises: generating a digital output code representing a time difference between a reference clock and a feedback clock; applying pulses of phases at a first frequency to a mixing node; applying the digital output code to the mixing node; monitoring the digital output code during a closed loop operation of a phase locked loop, wherein the closed loop operation applies the code obtained from the mixing node; and modifying the digital output code according to monitored digital output code.

In some embodiments, applying pulses of phases at the first frequency to the mixing node comprises: adding the pulses of phases to the digital output code at the mixing node, or subtracting the pulses of phases from the digital output code at the mixing node. In some embodiments, the method comprises: adjusting the first frequency to a second frequency, wherein the first and second frequencies indicate how often the pulses of phases from, being added to the digital output code at the mixing node, to being subtracted from the digital output code at the node, and wherein the first frequency is lower than the second frequency.

In some embodiments, the first frequency is at most 2 MHz, and wherein the second frequency is at least 5 MHz. In some embodiments, in response to applying pulses of phases at the first frequency to the mixing node, the method comprises: monitoring an amplitude of the digital output code to determine whether an amplitude is greater than a first threshold of an amplitude of the pulses of phases. In some embodiments, the method comprises: adjusting a resolution of a circuitry when it is determined that the amplitude of the digital output code is less than or equal to the first threshold of the amplitude of the pulses of phases.

In some embodiments, adjusting the resolution is performed so long as the amplitude of the digital output code is less than the first threshold of the amplitude of the pulses of phases. In some embodiments, the method comprises: applying, at the second frequency, the pulses of phases; and monitoring an amplitude of the digital output code to determine whether the amplitude is greater than a second threshold of an amplitude of the pulses of phases. In some embodiments, the method comprises: adjusting the resolution when it is determined that the amplitude of the digital output code is greater than or equal to the second threshold of the pulses of phases.

In some embodiments, adjusting the resolution is performed so long as the amplitude of the digital output code is greater than the second threshold of the pulses of phases. In some embodiments, the method comprises: programming the first and second thresholds. In some embodiments, the method comprises: setting the first and second thresholds at 0.7.

In another example, an apparatus is provided which comprises: means for generating a digital output code representing a time difference between a reference clock and a feedback clock; means for applying pulses of phases at a first frequency to a mixing node; means for applying the digital output code to the mixing node; means for monitoring the digital output code during a closed loop operation of a phase locked loop, wherein the closed loop operation applies the code obtained from the mixing node; and means for modifying the digital output code according to monitored digital output code.

In some embodiments, the apparatus comprises: the means for applying pulses of phases at the first frequency to the mixing node comprises: means for adding the pulses of phases to the digital output code at the mixing node, or means for subtracting the pulses of phases from the digital output code at the mixing node. In some embodiments, the apparatus comprises: means for adjusting the first frequency to a second frequency, wherein the first and second frequencies indicate how often the pulses of phases from, being added to the digital output code at the mixing node, to being subtracted from the digital output code at the node, and wherein the first frequency is lower than the second frequency.

In some embodiments, the first frequency is at most 2 MHz, and wherein the second frequency is at least 5 MHz. In some embodiments, in response to applying pulses of phases at the first frequency to the mixing node, the apparatus comprises: means for monitoring an amplitude of the digital output code to determine whether an amplitude is greater than a first threshold of an amplitude of the pulses of phases. In some embodiments, the apparatus comprises: means for adjusting a resolution of a circuitry when it is determined that the amplitude of the digital output code is less than or equal to the first threshold of the amplitude of the pulses of phases.

In some embodiments, the means for adjusting the resolution is performed so long as the amplitude of the digital output code is less than the first threshold of the amplitude of the pulses of phases. In some embodiments, the apparatus comprises: means for applying, at the second frequency, the pulses of phases; and means for monitoring an amplitude of the digital output code to determine whether the amplitude is greater than a second threshold of an amplitude of the pulses of phases.

In some embodiments, the apparatus comprises: means for adjusting the resolution when it is determined that the amplitude of the digital output code is greater than or equal to the second threshold of the pulses of phases. In some embodiments, the means for adjusting the resolution is performed so long as the amplitude of the digital output code is greater than the second threshold of the pulses of phases. In some embodiments, the apparatus comprises means for programming the first and second thresholds. In some embodiments, the apparatus comprises: means for setting the first and second thresholds at 0.7.

In another example, a system is provided which comprises: a memory; a processor coupled to the memory, the processor including an apparatus according to the apparatus described above; and a wireless interface for allowing the processor to communicate with another device.

In another example, a method is provided which comprises: generating a digital output code representing a time difference between a reference clock and a feedback clock; applying a digital code to a mixing node; applying the digital output code to the mixing node; filtering an output of the mixing node; monitoring the filtered output; and adjusting a resolution of a circuitry according to the monitored filtered output.

In some embodiments, applying the digital code comprises: adding the digital code to the digital output code at the mixing node, or subtracting the digital code from the digital output code at the mixing node. In some embodiments, the method comprises: adjusting a first frequency to a second frequency, wherein the first and second frequencies indicate how the digital code switches from, being added to the digital output code at the mixing node, to being subtracted from the digital code at the node, and wherein the first frequency is lower than the second frequency. In some embodiments, the first frequency is at most 2 MHz, and wherein the second frequency is at least 5 MHz.

In some embodiments, the method comprises: applying, at the first frequency, the digital code; and controlling a resolution of a circuitry by monitoring a ratio of amplitudes of a triangular model representing the filtered output. In some embodiments, the method comprises: determining whether the ratio is less than a threshold; and adjusting the resolution when the ratio is greater than the threshold. In some embodiments, the method comprises: applying, at the second frequency, the digital code; and controlling the resolution of the circuitry by monitoring a ratio of amplitudes of a triangular model representing the filtered output. In some embodiments, the method comprises: determining whether the ratio is greater than a threshold; and adjusting the resolution when the ratio is less than the threshold.

In another example, an apparatus is provided which comprises: means for generating a digital output code representing a time difference between a reference clock and a feedback clock; means for applying a digital code to a mixing node; means for applying the digital output code to the mixing node; means for filtering an output of the mixing node; means for monitoring the filtered output; and means for adjusting a resolution of a circuitry according to the monitored filtered output.

In some embodiments, the means for applying the digital code comprises: means for adding the digital code to the digital output code at the mixing node, or means for subtracting the digital code from the digital output code at the mixing node. In some embodiments, the apparatus comprises: means for adjusting a first frequency to a second frequency, wherein the first and second frequencies indicate how the digital code switches from, being added to the digital output code at the mixing node, to being subtracted from the digital code at the node, and wherein the first frequency is lower than the second frequency. In some embodiments, the first frequency is at most 2 MHz, and wherein the second frequency is at least 5 MHz.

In some embodiments, the apparatus comprises: means for applying, at the first frequency, the digital code; and means for controlling a resolution of a circuitry by monitoring a ratio of amplitudes of a triangular model representing the filtered output. In some embodiments, the apparatus comprises: means for determining whether the ratio is less than a threshold; and means for adjusting the resolution when the ratio is greater than the threshold. In some embodiments, the apparatus comprises: means for applying, at the second frequency, the digital code; and means for controlling the resolution of the circuitry by monitoring a ratio of amplitudes of a triangular model representing the filtered output. In some embodiments, the apparatus comprises: means for determining whether the ratio is greater than a threshold; and means for adjusting the resolution when the ratio is less than the threshold.

In another example, a system is provided which comprises: a memory; a processor coupled to the memory, the processor including an apparatus according to the apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a time-to-digital converter (TDC) to receive a reference clock and a feedback clock, wherein the TDC is to generate a digital output code representing a time difference between the reference clock and the feedback clock;
   a loop filter coupled to the TDC, wherein the loop filter is to receive a modulated output of the TDC as input, wherein the modulated output is a modulated version of the digital output code; and
   a first circuitry to monitor one of: the digital output code from the TDC, an output of the loop filter, or both, to adjust bandwidth of a second circuitry having the TDC and the loop filter, wherein the first circuitry is to apply a digital code to the digital output code.

2. The apparatus of claim 1, wherein the first circuitry is to control filter coefficients for the loop filter according to the monitored digital output code.

3. The apparatus of claim 2, wherein the first circuitry is to control the filter coefficients for the loop filter according to the monitored digital output code and the output of the loop filter.

4. The apparatus of claim 1 comprises an oscillator coupled to the loop filter.

5. The apparatus of claim 4 comprises a divider coupled to an output of the oscillator and an input of the TDC, wherein the divider is to provide the feedback clock to the TDC.

6. The apparatus of claim 1 wherein the first circuitry is to control a resolution of the TDC according to the monitored digital output code.

7. The apparatus of claim 1, wherein the TDC and the loop filter are part of a phase locked loop, wherein the second circuitry comprises the phase locked loop.

8. The apparatus of claim 1, wherein the TDC and the loop filter are part of a delay locked loop wherein the second circuitry comprises the delay locked loop.

9. An apparatus comprising:
a phase locked loop including a time-to-digital converter (TDC) to receive a reference clock and a feedback clock; and
a bandwidth calibration circuitry coupled to the PLL, wherein the bandwidth calibration circuitry is to monitor one of: an output of the TDC, output of a loop filter coupled to the TDC, or both, to adjust bandwidth of the PLL;
wherein the TDC is to generate a digital output code representing a time difference between the reference clock and the feedback clock; and
wherein the bandwidth calibration circuitry is to apply, at a first frequency a digital code to the digital output code.

10. The apparatus of claim 9, wherein the bandwidth calibration circuitry is to then monitor an amplitude of the digital output code from the TDC to determine whether the amplitude is greater than a first threshold of an amplitude of the digital code applied by the bandwidth calibration circuitry.

11. The apparatus of claim 10, wherein the bandwidth calibration circuitry is to control the TDC to cause the TDC to adjust its resolution when it is determined that the amplitude of the digital output code from the TDC is less than or equal to the first threshold of the amplitude of the digital code applied by the bandwidth calibration circuitry.

12. The apparatus of claim 10, wherein the bandwidth calibration circuitry is to control the TDC to cause the TDC to adjust its resolution so long as the amplitude of the digital output code from the TDC is less than the first threshold of the amplitude of the digital code applied by the bandwidth calibration circuitry.

13. The apparatus of claim 10, wherein the bandwidth calibration circuitry is to adjust coefficients of the loop filter to when it is determined that the amplitude of the digital output code from the TDC is less than or equal to the first threshold of the amplitude of the digital code applied by the bandwidth calibration circuitry.

14. The apparatus of claim 10, wherein the bandwidth calibration circuitry is to adjust coefficients of the loop filter so long as the amplitude of the digital output code from the TDC is less than the first threshold of the amplitude of the digital code applied by the bandwidth calibration circuitry.

15. The apparatus of claim 10, wherein the bandwidth calibration circuitry is to apply, at the second frequency the digital code, wherein the second frequency is higher than the first frequency.

16. The apparatus of claim 15, wherein the bandwidth calibration circuitry is to then monitor an amplitude of the digital output code from the TDC to determine whether the amplitude is greater than a second threshold of an amplitude of the digital code applied by the bandwidth calibration circuitry.

17. The apparatus of claim 15, wherein the bandwidth calibration circuitry is to control the TDC to cause the TDC to adjust its resolution when it is determined that the amplitude of the digital output code from the TDC is greater than or equal to the second threshold of the digital code applied by the bandwidth calibration circuitry.

18. The apparatus of claim 15, wherein the bandwidth calibration circuitry is to control the TDC to cause the TDC to adjust its resolution so long as the amplitude of the digital output code from the TDC is greater than the second threshold of the digital code applied by the bandwidth calibration circuitry.

19. The apparatus of claim 15, wherein the bandwidth calibration circuitry is to adjust coefficients of the loop filter to when it is determined that the amplitude of the digital output code from the TDC is greater than or equal to the second threshold of the amplitude of the digital code applied by the bandwidth calibration circuitry.

20. The apparatus of claim 15, wherein the bandwidth calibration circuitry is to adjust coefficients of the loop filter so long as the amplitude of the digital output code from the TDC is greater than the second threshold of the amplitude of the digital code applied by the bandwidth calibration circuitry.

21. A system comprising:
a memory;
a processor coupled to the memory, the processor including a locked loop which includes:
a time-to-digital converter (TDC) to receive a reference clock and a feedback clock, wherein the TDC is to generate a digital output code representing a time difference between the reference clock and the feedback clock; and
a loop filter coupled to the TDC, wherein the loop filter is to receive a modulated output of the TDC as input, wherein the modulated output is a modulated version of the digital output code;
a circuitry to monitor one of: the digital output code from the TDC, an output of the loop filter, or both, to adjust bandwidth of the locked loop, wherein the circuitry is to apply a digital code to the digital output code; and
a wireless interface to allow the processor to communicate with another device.

22. The system of claim 21, wherein the locked loop is one of a phase locked loop or a delay locked loop.

* * * * *